United States Patent [19]
Callahan, Jr.

[11] Patent Number: 5,939,909
[45] Date of Patent: Aug. 17, 1999

[54] DRIVER CIRCUIT HAVING PRESLEWING CIRCUITRY FOR IMPROVED SLEW RATE CONTROL

[75] Inventor: Michael J. Callahan, Jr., Austin, Tex.

[73] Assignee: STMicroelectronics, Inc., Carrollton, Tex.

[21] Appl. No.: 09/052,187

[22] Filed: Mar. 31, 1998

[51] Int. Cl.$^6$ ....................................................... H03B 1/00
[52] U.S. Cl. ........................................... 327/108; 327/170
[58] Field of Search ..................................... 327/108, 110, 327/170, 374, 380, 381, 427, 561, 563

[56] References Cited

U.S. PATENT DOCUMENTS

| | | | |
|---|---|---|---|
| 5,742,193 | 4/1998 | Colli et al ................................. | 327/170 |
| 5,828,245 | 10/1998 | Brambilla et al. ...................... | 327/108 |

*Primary Examiner*—Timothy P. Callahan
*Assistant Examiner*—Jeffrey Zweizig
*Attorney, Agent, or Firm*—Theodore E. Galanthay; Lisa K. Jorgenson; Renee M. Larson

[57] ABSTRACT

A driver circuit for a power device of a power driving stage is capable of providing slew rate control. The driver circuit includes the following elements: a charging source of current, a discharging source of current, a first switch, a second switch, a conductive device, a capacitive element, an amplifier, and the power device. Both the first and second switches receive a control signal. The elements of the driver circuit are configured such that the conductive device will conduct only when the following two conditions are met: the control signal is a certain logic level and the voltage generated by the amplifier is larger than a reference voltage. When the control signal transitions from a first to a second logic state, a charging current is delivered to the capacitive element, an output voltage of the driver circuit increased to the reference voltage, and a voltage on a control terminal of the power device also increases to a charge pump voltage level. When the control signal transitions from the second to the first logic state, the conductive device conducts as long as the output voltage generated by the power device is larger than the reference voltage and the discharging source of current operates to quickly discharge the capacitive element so that the voltage at the node at the input terminal of the amplifier is quickly reduced until it approximates the reference voltage.

30 Claims, 5 Drawing Sheets

DRIVER CIRCUIT HAVING PRESLEWING CIRCUITRY FOR IMPROVED SLEW RATE CONTROL

BACKGROUND OF THE INVENTION

The present invention relates to drive circuits for a power device of a power driving stage and particularly to a driver circuit operating from a supply voltage (e.g., a charge pump voltage) that is higher than the supply voltage of the power device. The invention is particularly beneficial for high side drivers in integrated circuits for energizing spindle motor coils, such as for hard disk drives.

A driver circuit is generally a relatively low power circuit that drives, or controls, a higher power device. The power device may be part of a power driving stage for a load. An example is a load that is a motor, such as a brushless motor, that provides the motive force for a spindle of a hard disk drive. Similar driver circuits are applied elsewhere, such as in voice coil motor (VCM) systems. One of the most widely used types of driver circuits in such applications uses a three-phase brushless motor in a configuration in which current energizes respective motor coils using a full wave bridge configuration. The bridge includes two power stages for each phase, so typically there are six power stages, each with a power device. Three of the power stages, and their power devices, are referred to as being "low side" stages and devices because they are connected between a motor coil and ground. The other three of the power stages, and their power devices, are referred to as "high side" stages and devices because they are connected between a power supply and a motor coil.

The power devices are operated as switches in a sequence that allows pulses of current to flow from the power supply through a high side power device, a coil of a first of the three stages, a coil of a second of the three stages, and then through a low side power device to ground. This process is repeated in a generally well known manner for the other power devices and coil pairs to achieve three-phase energization from a single, direct current, power supply. The switching, or commutation, characteristics of the power devices are very important in achieving good performance from the motor and other favorable characteristics.

Control of the switching of the power devices is performed by a driver circuit for each power device. In the typical use described above with six power stages, there are three low side drivers and three high side drivers. The power devices may be of a variety of electronic switch devices and the driver circuits are configured suitably for the power devices. Power devices of general application to hard disk drives, and the like, are each often an MOS (metal-oxide-semiconductor) FET (field effect transistor). One type of such transistors of considerable interest is referred to as a DMOS transistor (D referring to a double diffusion process used in its manufacture).

DMOS devices can be readily integrated in chips with other circuitry, including lower power control circuitry. So it is attractive to have an entire set of drive stages, including all the power devices and all the driver circuits for the power devices, in one chip.

Even where all the power devices are alike, e.g., N channel DMOS devices, it is generally the case that the high side drivers differ from the low side drivers because high side drivers for such power devices often require a voltage, referred to as a charge pump voltage or boost voltage at a higher voltage level than that supplied by the power supply for the power stages. By known techniques, a charge pump voltage may be generated from the supply voltage and used by all the high side drivers. Such an auxiliary supply is, however, power limited; the desired voltage can be supplied but at a modest current level.

The state of the art in the field of motion control using integrated signal and power components, the respective requirements of low and high side drivers, and the characteristics sought in applications of motor drives are described more fully in *Smart Power ICs*, B. Murari et al., Eds., 1995, particularly Chapter 5, "Motion Control" by R. Gariboldi, at pp. 225–283, which is herein incorporated by reference for its description of background to the present invention.

As is known, for example from the above-mentioned Gariboldi publication, for applications such as hard disk drives, it is of utmost importance to control the output voltage slope in order to reduce electromagnetic interference (EMI). Generally, the slope is desired to be steep but not so abrupt as to cause any appreciable noise. Drive circuits have therefore generally included slew rate control circuits to achieve fast, smooth transitions.

Techniques previously used for high side slew rate control (cf., Gariboldi) have included one in which the gate node of a power DMOS device is charged and discharged by constant current sources. A first constant current source is applied between the charge pump voltage supply and the gate node. A second constant current source is applied between the gate node and ground. The inherent input capacitance of the power device during rise and fall times is relatively constant. The slew rate or voltage slope is proportional to the sourced currents divided by the capacitance. Another known slew rate control technique uses a capacitor separate from the inherent capacitance of the power device. It can be more accurate since the specific capacitance used can be better controlled. However, practical limitations are encountered in order to integrate such a circuit into a small chip area.

These limitations are related to the fact that the high side power device requires an overvoltage driving signal at its gate of about 10 v. more than the motor voltage supply. If the motor voltage supply is, for example, 17 v., as the gate voltage rises to approximately 17 v., the output voltage also rises to about 17 v. When the gate voltage starts to ramp up from 17 v. to about 27 v., the high side op-amp pushes the gate to the charge pump voltage of 27 v. A problem arises, particularly when there is to be a transition or commutation from on to off and the drive is to be reduced with a fixed slew rate. At the beginning of such a transition, the gate is at the overvoltage of about 27 v. and the source of the power device is at about 17 v. It therefore takes time to discharge the gate down to 17 v. when the output can start reducing. Preslewing is a process to reduce that delay. To do so with past circuit designs for a good slew rate control requires elements occupying a very substantial chip area. It is desirable, at least for some drives, for the commutation to occur at least as fast as 15 v./microsecond. That would normally mean a huge P-channel device and a huge lateral N-channel DMOS structure in a current sinking path of a preslewing circuit. Huge, in this context, means about 400–600 microns for the channel width.

There is thus an unmet need in the art to be able to utilize a method for achieving effective slew rate control utilizing readily integrable elements by utilizing basic elements to achieve slew rate control in a circuit which is relatively easy to fabricate and which achieves a rapid turn-off of load current even when gate voltage of the output switching device is boosted with a separate voltage supply. Therefore, it would be advantageous in the art to be able to describe a method for overcoming the undesirable effects that occur when the gate voltage utilizes a separate boost supply and rapid load turn-off is required.

SUMMARY OF THE INVENTION

It is an object of the present invention to achieve effective slew rate control in a driver circuit for a power device of a power driving stage.

It is another object of the present invention that such a driver circuit be relatively easy to fabricate.

It is accordingly a further object of the invention that such a driver circuit achieve effective slew rate control in a manner that features a rapid turn-off of load current even when gate voltage of the output switching device is boosted with a separate voltage supply.

Therefore, according to the present invention, a driver circuit having a slew rate control system capable of achieving the foregoing objects is disclosed. The structure of the driver circuit includes the following elements: a charging source of current such as a constant current source, a discharging source of current, a first switch such as a single-pole single throw switch, a second switch such as a single-pole double-throw switch, a conductive device such as a transistor having a controllable conduction path, a capacitive element, an amplifier, and a power device such as a power transistor. Both the first and second switches receive a control signal. The elements of the driver circuit are configured in such as way that the conductive device will conduct only when two conditions are met: the control signal is a certain logic level and the voltage generated by the amplifier is larger than a reference voltage such as Vcc; once these conditions are met, the conductive device will conduct until a voltage on a node at an input terminal of the amplifier is reduced to the reference voltage. The first source of current may be characterized as being larger in magnitude than the second source of current to ensure that the capacitive element is charged upon the control signal transitioning from a first to a second logic state.

The operation of the driver circuit ensures that when the control signal transitions from a first to a second logic state, a charging current is delivered to the capacitive element, an output voltage of the driver circuit increased to the reference voltage, and a voltage on a control terminal of the power device also increases to a charge pump voltage level. Upon the control signal transitioning from the second to the first logic state, the conductive device conducts so long as the output voltage generated by the power device is larger than the reference voltage and the discharging source of current operates to quickly discharge the capacitive element so that the voltage at the node at the input terminal of the amplifier is quickly reduced until it approximates the reference voltage.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing(s), wherein:

DESCRIPTION OF THE INVENTION

The present invention describes a circuit technique that achieves effective slew rate control, with readily integrated elements, by combining with the basic elements of a slew rate control system a relatively easy to fabricate preslewing circuit. The preslewing circuit affects the current sinking to be performed when the drive circuit is fully on, a command to transition off has been received by the drive and the gate is still above the source voltage. It is desirable to bring the gate voltage down to the source voltage quickly in order that the actual transition of the output voltage of the drive circuit can begin, under the influence of the basic elements of a slew rate control system.

Figure 1A:
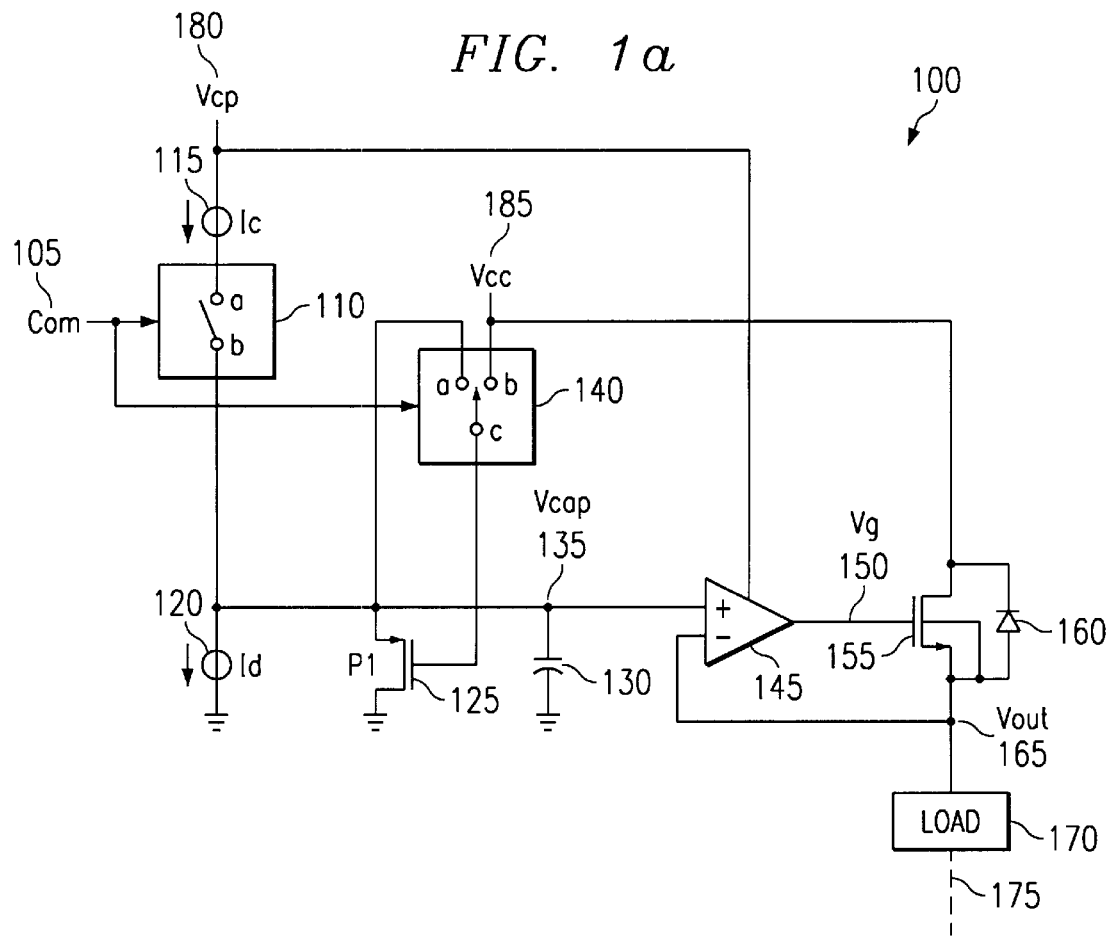
FIG. 1a and 1b disclose a Driver Circuit with Improved Slew Rate Control, according to a first embodiment of the present invention.
Figure 1B:
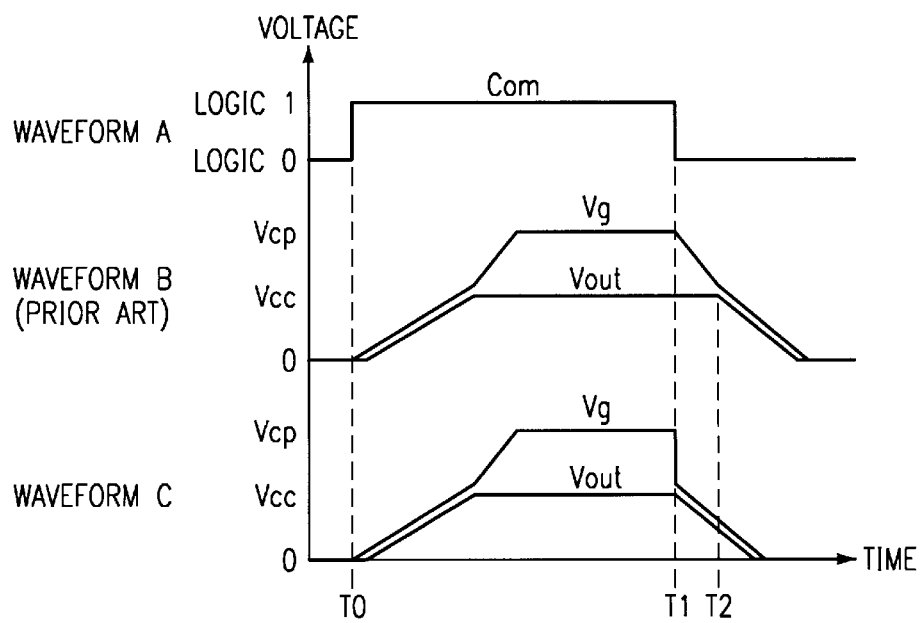

Referring to FIG. 1a and 1b, a first embodiment of the present invention with schematic 100 and waveform is presented. 100 includes MOS Power Transistor 155, which in this example is a MOS transistor, and more specifically an N-channel DMOS transistor. DMOS transistors are known power devices, and MOS Power Transistor 155 is illustrated with Intrinsic Diode 160 between its body and drain as is typical.

MOS Power Transistor 155 has a controllable conduction path through a channel between its drain and source. A gate electrode serves as a control electrode for controlling conduction through this channel in response to Gate Voltage 150, as is well known. Gate Voltage 150 is generated by Operational Amplifier 145.

In this example, MOS Power Transistor 155 is connected for selectively applying power to Load 170, which is above ground potential as indicated by Low-side Load Potential 175. This circuit is therefore referred to as a high side driver. The circumstances described in the background above show particular requirements of high side DMOS drivers that are to be improved, particularly where Load 170 is a set of inductive motor coils of multiple phases with additional high side driver circuits (not shown) all integrated with MOS Power Transistor 155 in the same chip.

MOS Power Transistor 155 receives Supply Voltage Source 185 from a first power supply connected to its drain. Supply Voltage Source 185 is typically from an external supply and is typically equal to 12 to 17 volts. The characteristics of DMOS devices like MOS Power Transistor 155 require a second voltage referred to as Charge-pump Voltage Source 180. Charge-pump Voltage Source 180 is at a voltage level higher than Supply Voltage Source 185, and may typically be 27 volts. Charge-pump Voltage Source 180 is typically generated by known means within the chip.

Charge-pump Voltage Source 180 is applied to Operational Amplifier 145 and First Constant-current Source 115. First Constant-current Source 115 supplies current to terminal a of Single-pole Single-throw Switch 110. Terminal b of Single-pole Single-throw Switch 110 is connected to Second Constant-current Source 120, P-channel Transistor 125, terminal a of Single-pole Double-throw Switch 140, Slew-rate Capacitor 130 and the positive (non-inverting) input of Operational Amplifier 145. Second Constant-current Source 120 is connected between terminal b of Single-pole Single-throw Switch 110 and ground, and delivers current toward ground. The inverting input of Operational Amplifier 145 is connected to Output Voltage 165. P-channel Transistor 125 is connected between terminal b of Single-pole Single-throw Switch 110 and ground. The gate of P-channel Transistor 125 is connected to terminal c of Single-pole Double-throw Switch 140. Slew-rate Capacitor 130 is connected between terminal b of Single-pole Single-throw Switch 110 and ground.

Single-pole Single-throw Switch 110 and Single-pole Double-throw Switch 140 are controlled by Drive Command Input 105. Drive Command Input 105 can be generated either externally or internal to the chip. When Drive Command Input 105 is at a logic level low Single-pole Single-throw Switch 110 is in the open condition, the first terminal a of Single-pole Double-throw Switch 140 is conducting to terminal c of Single-pole Double-throw Switch 140 and the terminal b of Single-pole Double-throw Switch 140 is non-conducting. When Drive Command Input 105 is at a logic level high Single-pole Single-throw Switch 110 is in the conducting or shorted condition. The Single-pole Double-throw Switch 140 is connected to the a terminal and P-channel Transistor P1 125 is off. There is no connectivity between the a terminal and the b terminal of Single-pole Double-throw Switch 140 under any conditions.

The conductivity of the drain to source channel of P-channel Transistor 125 is controlled by the voltage differential present between the source and gate of P-channel Transistor 125. P1 P-channel Transistor 125 will conduct only when two conditions are met: first, Drive Command Input 105 must be a logic level low and second, Vout Output Voltage 165 must be a larger voltage than Vcc Supply Voltage Source 185. When Drive Command Input 105 is logic level high (1), the c terminal of Single-pole Double-throw Switch 140 is connected to terminal a of Single-pole Double-throw Switch 140 with the result that there is essentially no voltage differential between the gate and source of P-channel Transistor 125. Under this condition P-channel Transistor 125 never conducts and thus represents an open circuit between Slew-rate Capacitor Voltage 135 and ground. Conversely, when Drive Command Input 105 is logic level low, there is the possibility that P1 P-channel Transistor 125 will conduct if Vout Output Voltage 165 is higher than Vcc Supply Voltage Source 185. There is conductivity between the gate of P-channel Transistor 125 and Supply Voltage Source 185 because Single-pole Double-throw Switch 140 is conducting between its b terminal and c terminal. P-channel Transistor 125 will remain conductive until Slew-rate Capacitor Voltage 135 reduces to a value approximately equal to Supply Voltage Source 185, since at that time the gate voltage of P-channel Transistor 125 will approximate that of Slew-rate Capacitor Voltage 135.

A description of the basic operation of the circuit will now follow. When Drive Command Input 105 is at logic level low, Single-pole Single-throw Switch 110 is open. First Constant-current Source 115 therefore does not supply any charging current to Slew-rate Capacitor 130. Second Constant-current Source 120 has reduced the charge on Slew-rate Capacitor 130 to zero, and therefore Slew-rate Capacitor Voltage 135 is zero. The combination of Operational Amplifier 145 and MOS Power Transistor 155 is a voltage-follower circuit arrangement, and is well known in the art. Output Voltage 165 is therefore equal to Slew-rate Capacitor Voltage 135 which, as previously discussed, is zero. Refer to Waveform A of FIG. 1b, which indicates that prior to time T0, Drive Command Input 105 is logic low, and Waveforms B and C which show that prior to time T0, Output Voltage 165 is zero.

With P-channel Transistor 125 and Single-pole Double-throw Switch 140 removed from the drawing, the circuit functions as a typical slew rate controlled driver. When Drive Command Input 105 goes to logic high, Single-pole Single-throw Switch 110 conducts and First Constant-current Source 115 delivers current to charge Slew-rate Capacitor 130 at the same time Second Constant-current Source 120 is discharging Slew-rate Capacitor 130. The circuit is designed so that the magnitude of First Constant-current Source 115 is greater that that of Second Constant-current Source 120. There is therefore a net positive charging current delivered to Slew-rate Capacitor 130. As a result Slew-rate Capacitor Voltage 135, Gate Voltage 150 and Output Voltage 165 all increase. Refer to Waveform B of FIG. 1b, which shows that initially Output Voltage 165 and Gate Voltage 150 both increase until Output Voltage 165 is limited by Supply Voltage Source 185. Gate Voltage 150 will increase until it becomes limited by Charge-pump Voltage Source 180 and, to some extent, the ability of Operational Amplifier 145 to drive in a positive direction. For purposes of illustration, assume that the output of Operational Amplifier 145 may increase, when going positive, to Charge-pump Voltage Source 180. The slope of Gate Voltage 150 may change after Output Voltage 165 becomes limited by Supply Voltage Source 185 as illustrated by Waveform B of FIG. 1b. The differential between Gate Voltage 150 and Output Voltage 165 shown in Waveforms B and C is required for proper operation of MOS Power Transistor 155.

If Drive Command Input 105 then returns to logic low, shown at time T1, switch Single-pole Single-throw Switch 110 will open, First Constant-current Source 115 cannot charge Slew-rate Capacitor 130, and Second Constant-current Source 120 acts to discharge Slew-rate Capacitor 130. Therefore Slew-rate Capacitor Voltage 135 will decrease, and Gate Voltage 150 will follow. When Gate Voltage 150 is approximately equal to Output Voltage 165, Output Voltage 165 will follow Slew-rate Capacitor Voltage 135. This is shown in Waveform B of FIG. 1b for time >T2. If Drive Command Input 105 remains at logic low, Gate Voltage 150 and Output Voltage 165 will decrease to and remain at zero as discussed previously. The problem with this circuit is that Output Voltage 165 does not start to decrease until Gate Voltage 150 has decreased sufficiently. This represents an undesirable delay in the reduction of Output Voltage 165 with respect to the change of Drive Command Input 105, and in Waveform B is the quantity T2−T1.

With P-channel Transistor 125 and Single-pole Double-throw Switch 140 now in the circuit, as shown, when Drive Command Input 105 goes to logic high Single-pole Single-throw Switch 110 conducts and First Constant-current Source 115 delivers current to charge Slew-rate Capacitor 130 at the same time Second Constant-current Source 120 is acting to discharge Slew-rate Capacitor 130. The circuit is designed so that the magnitude of First Constant-current Source 115 is greater than the magnitude of Second Constant-current Source 120, so that there is a net positive charging current delivered to Slew-rate Capacitor 130. There is no current through P-channel Transistor 125 because its gate and source are connected through Single-pole Double-throw Switch 140. Slew-rate Capacitor Voltage 135, Gate Voltage 150 and Output Voltage 165 all increase, as before. Refer to Waveform C of FIG. 1b, which shows that Output Voltage 165 and Gate Voltage 150 both increase until Output Voltage 165 is limited by Supply Voltage Source 185. Gate Voltage 150 will increase until it becomes limited by Charge-pump Voltage Source 180 and, to some extent, the ability of Operational Amplifier 145 to drive in a positive direction. For purposes of illustration, assume that the output of Operational Amplifier 145 may increase, when going positive, to Charge-pump Voltage Source 180. The slope of Gate Voltage 150 may change after Output Voltage 165 becomes limited by Supply Voltage Source 185 as illustrated by Waveform C of FIG. 1b. The differential between Gate Voltage 150 and Output Voltage 165 is required for proper operation of MOS Power Transistor 155.

If Drive Command Input 105 then returns to logic low, as shown at time T1, switch Single-pole Single-throw Switch 110 will open, First Constant-current Source 115 will not charge Slew-rate Capacitor 130, and Second Constant-current Source 120 acts to discharge Slew-rate Capacitor 130. However, the gate voltage of P-channel Transistor 125 now becomes equal to Supply Voltage Source 185 because Drive Command Input 105 changes the state of Single-pole Double-throw Switch 140. This provides the opportunity for P1 P-channel Transistor 125 to conduct to ground only if Vout Output Voltage 165 is greater in magnitude than Vcc Supply Voltage Source 185. When Vout Output Voltage 165 is less than Vcc Supply Voltage Source 185, P1 P-channel Transistor 125 does not conduct. If P1 P-channel Transistor 125 does conduct to ground, Slew-rate Capacitor 130 is discharged quickly until Slew-rate Capacitor Voltage 135 is reduced to a value approximately equal to Supply Voltage Source 185. At that point P-channel Transistor 125 again becomes non-conductive, and the discharge of Slew-rate Capacitor 130 proceeds as in the previous paragraph. Referring to Waveform C of FIG. 1b, it can be seen that the charging and holding characteristics of the circuit are unchanged from those described in the previous paragraph. The difference occurs when Drive Command Input 105 changes to a logic low and Slew-rate Capacitor Voltage 135 and Gate Voltage 150 are very quickly reduced in magnitude, thereby overcoming the T1–T2 delay disadvantage of the standard circuit. The rate of change in Gate Voltage 150 at time T1 is limited only by the slew rate of Operational Amplifier 145, which will be selected or designed to reduce Gate Voltage 150 as rapidly as required. Note that since Slew-rate Capacitor 130 is typically a small capacitor, P-channel Transistor 125 may be a small transistor.

As previously described, the magnitude of First Constant-current Source 115 is greater than the magnitude of Second Constant-current Source 120 so that a net positive charging current is delivered to Slew-rate Capacitor 130 when Drive Command Input 105 goes to a logic high. It will be recognized by one of ordinary skill in the art that when Drive Command Input 105 is a logic high, the charging of Slew-rate Capacitor 130 may be accomplished by only one current source, without the need for subtraction of a smaller current source from a larger current source. To accomplish this implementation, when Drive Command Input 105 is a high logic state, smaller current source 120 could be turned off by a switch or other means, not shown, thereby allowing First Constant-current Source 115 to solely charge Slew-rate Capacitor 130. This arrangement has the same effect without the need for the subtraction of a discharging current source from a charging current source to render an overall charging of Slew-rate Capacitor 130.

Additionally, it is understood that rather than Slew-rate Capacitor 130 being charged and discharged by First Constant-current Source 115 and Second Constant-current Source 120, respectively, it is conceived that Slew-rate Capacitor 130 may be charged and discharged by other sources of current such as by resistive elements or by transistors, for instance.

Moreover, it is understood that while Slew-rate Capacitor 130 is coupled to ground potential in FIG. 1a, it may otherwise be connected to any arbitrary reference potential desired, including a positive or a negative reference voltage potential. Similarly, P-channel Transistor 125 is shown in FIG. 1a as being coupled to ground potential but it could also be connected to any arbitrary reference potential desired, including a positive or a negative reference voltage potential. For instance, P-channel Transistor 125 could be connected to Vcc, or any potential between Vcc and ground. It is further understood that Slew-rate Capacitor 130 and P-channel Transistor 125 may or may not be connected to the same reference voltage potential.

Figure 2A:
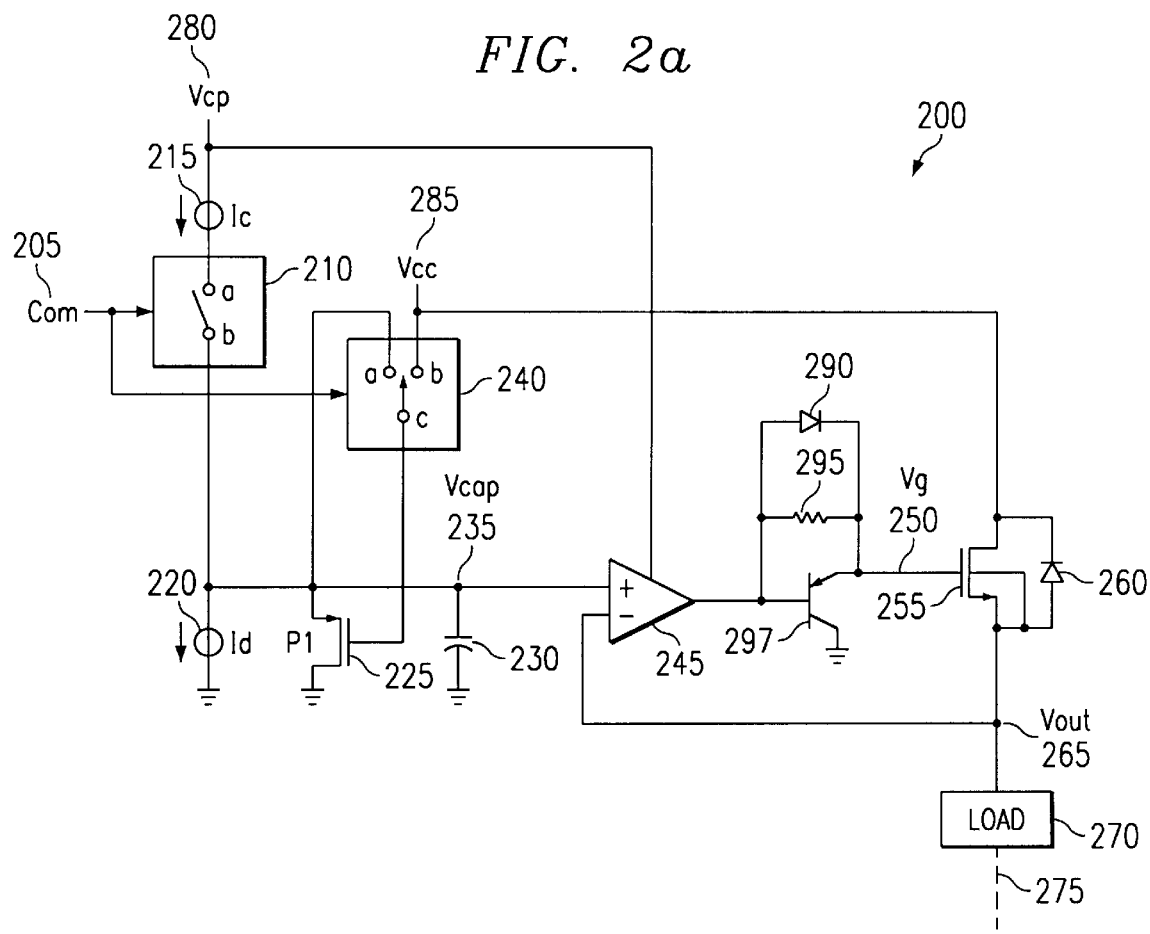
FIG. 2a and 2b disclose a Driver Circuit with Improved Slew Rate Control, according to a second embodiment of the present invention.
Figure 2B:
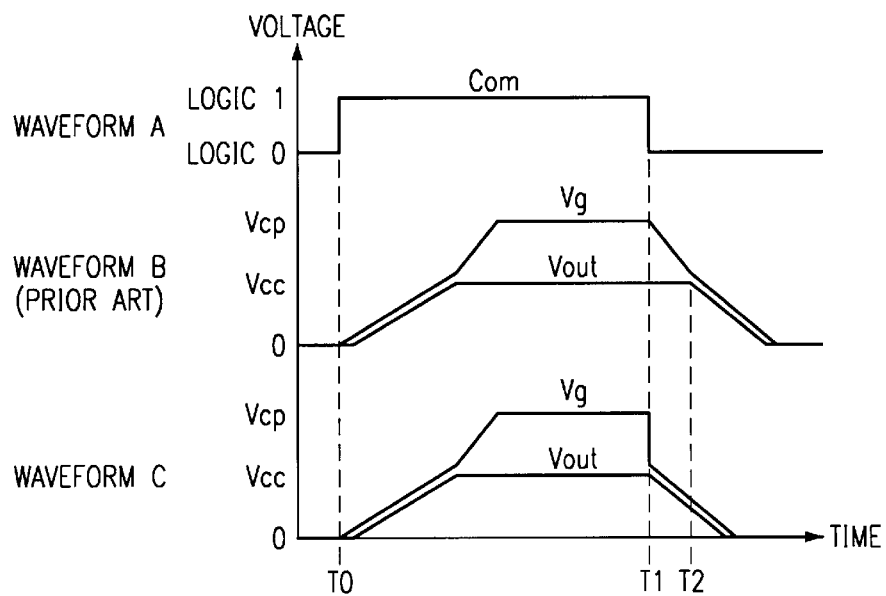

Referring now to FIGS. 2a and 2b, a second embodiment of the present invention, shown as schematic 200 with waveforms, is presented. Schematic 200 includes MOS Power Transistor 255, which in this example is a MOS transistor, and, more specifically, an N-channel DMOS transistor. DMOS transistors are known power devices, and MOS Power Transistor 255 is illustrated with Intrinsic Diode 260 between its body and drain as is typical.

MOS Power Transistor 255 has a controllable conduction path through a channel between its drain and source. A gate electrode serves as a control electrode for controlling conduction through this channel in response to Gate Voltage 250, as is well known. Gate Voltage 250 is generated by Operational Amplifier 245 and a high current drive circuit consisting of Resistor 295, Diode 290 and PNP Transistor 297. Often the input gate capacitance of a device such as MOS Power Transistor 255 is large, and current capability in excess of that typically available in operational amplifiers is required in order to rapidly change the voltage on the gate of MOS Power Transistor 255. The output of Operational Amplifier 245 is applied to the anode of Diode 290, Resistor 295, and the base of PNP Transistor 297. The collector of PNP Transistor 297 is grounded. The emitter of PNP Transistor 297, the cathode of Diode 290, and the other end of Resistor 295 are connected together and are connected to the gate of MOS Power Transistor 255.

In this example, MOS Power Transistor 255 is connected for selectively applying power to Load 270, which is above ground potential as indicated by Low-side Load Potential 275. This circuit is therefore referred to as a high side driver. The circumstances described in the background above show particular requirements of high side DMOS drivers that are to be improved, particularly where Load 270 is a set of inductive motor coils of multiple phases with additional high side driver circuits (not shown) all integrated with MOS Power Transistor 255 in the same chip.

MOS Power Transistor 255 receives Supply Voltage Source 285 from a first power supply connected to its drain. Supply Voltage Source 285 is typically from an external supply and is typically equal to 12 to 17 volts. The characteristics of DMOS devices like MOS Power Transistor 255 require a second voltage referred to as Charge-pump Voltage Source 280. Charge-pump Voltage Source 280 is at a voltage level higher than Supply Voltage Source 285, and may typically be 27 volts. Charge-pump Voltage Source 280 is typically generated by known means within the chip.

Charge-pump Voltage Source 280 is applied to Operational Amplifier 245 and First Constant-current Source 215. First Constant-current Source 215 supplies current to terminal a of Single-pole Single-throw Switch 210. Terminal b of Single-pole Single-throw Switch 210 is connected to Second Constant-current Source 220, P-channel Transistor 225, terminal a of Single-pole Double-throw Switch 240, Slew-rate Capacitor 230 and the positive (non-inverting) input of Operational Amplifier 245. Second Constant-current Source 220 is connected between terminal b of Single-pole Single-throw Switch 210 and ground, and delivers current toward ground as shown. The inverting input of Operational Amplifier 245 is connected to Output Voltage 265. P-channel Transistor 225 is connected between terminal b of Single-pole Single-throw Switch 210 and ground. The gate of P-channel Transistor 225 is connected to terminal c of Single-pole Double-throw Switch 240. Slew-rate Capacitor 230 is connected between terminal b of Single-pole Single-throw Switch 210 and ground.

Single-pole Single-throw Switch 210 and Single-pole Double-throw Switch 240 are controlled by Drive Command Input 205. Drive Command Input 205 can be generated either externally or internal to the chip. When Drive Command Input 205 is at a logic level low Single-pole Single-throw Switch 210 is in the open condition, the first terminal a of Single-pole Double-throw Switch 240 is conducting to terminal c of Single-pole Double-throw Switch 240 and terminal b of Single-pole Double-throw Switch 240 is non-conducting. When Drive Command Input 205 is at a logic level high Single-pole Single-throw Switch 210 is in the conducting or shorted condition. Single-pole Double-throw Switch 240 is connected to the a terminal and P1 P-channel Transistor 225 is off. There is no connectivity between the a and b terminals of Single-pole Double-throw Switch 240 under any conditions.

The conductivity of the drain to source channel of P-channel Transistor 225 is controlled by the voltage differential present between the source and gate of P-channel Transistor 225. P1 P-channel Transistor 225 will conduct only when two conditions are met: first, Drive Command Input 205 must be a logic level low and second, Vout Output Voltage 265 must be a larger voltage than Vcc Supply Voltage Source 285. When Drive Command Input 205 is logic level high (1), terminal c of Single-pole Double-throw Switch 240 is connected to terminal a of Single-pole Double-throw Switch 240 with the result that there is essentially no voltage differential between the gate and source of P-channel Transistor 225. Under this condition P-channel Transistor 225 never conducts and thus represents an open circuit between Slew-rate Capacitor Voltage 235 and ground. Conversely, when Drive Command Input 205 is logic level low, there is the possibility that P1 P-channel Transistor 225 will conduct if Vout Output Voltage 265 is higher than Vcc Supply Voltage Source 285. There is conductivity between the gate of P-channel Transistor 225 and Supply Voltage Source 285 because Single-pole Double-throw Switch 240 is conducting between its b and c terminals. P-channel Transistor 225 will remain conductive until Slew-rate Capacitor Voltage 235 reduces to a value approximately equal to Supply Voltage Source 285, since at that time the gate voltage of P-channel Transistor 225 will approximate that of Slew-rate Capacitor Voltage 235.

Basic operation of the circuit is as follows. When Drive Command Input 205 is at logic level low, Single-pole Single-throw Switch 210 is open. First Constant-current Source 215 therefore does not supply any charging current to Slew-rate Capacitor 230. Second Constant-current Source 220 has reduced the charge on Slew-rate Capacitor 230 to zero, and therefore Slew-rate Capacitor Voltage 235 is zero. The combination of Operational Amplifier 245, Diode 290, Resistor 295, PNP Transistor 297 and MOS Power Transistor 255 is a voltage-follower circuit arrangement, and is well known in the art. Output Voltage 265 is therefore equal to Slew-rate Capacitor Voltage 235, which as mentioned is zero. Refer to Waveform A of FIG. 2b, which indicates that prior to time T0, Drive Command Input 205 is logic low, and to Waveforms B and C which show that prior to time T0, Output Voltage 265 is zero.

With P-channel Transistor 225, Diode 290, Resistor 295, PNP Transistor 297 and Single-pole Double-throw Switch 240 removed from the drawing, the circuit functions as a typical slew rate controlled driver. When Drive Command Input 205 goes to logic high, Single-pole Single-throw Switch 210 conducts and First Constant-current Source 215 delivers current to charge Slew-rate Capacitor 230 at the same time Second Constant-current Source 220 is discharging Slew-rate Capacitor 230. The circuit is designed so that the magnitude of First Constant-current Source 215 is greater that that of Second Constant-current Source 220. There is therefore a net positive charging current delivered to Slew-rate Capacitor 230. As a result Slew-rate Capacitor Voltage 235, Gate Voltage 250 and Output Voltage 265 all increase. Refer to Waveform B of FIG. 2b, which shows that Output Voltage 265 and Gate Voltage 250 both increase until Output Voltage 265 is limited by Supply Voltage Source 285. Gate Voltage 250 will increase until it becomes limited by Charge-pump Voltage Source 180 and, to some extent, the ability of Operational Amplifier 245 to drive in a positive direction. For purposes of illustration, assume that the output of Operational Amplifier 245 may increase, when going positive, to Charge-pump Voltage Source 280. The slope of Gate Voltage 250 may change after Output Voltage 265 becomes limited by Supply Voltage Source 285 as illustrated by Waveform B of FIG. 2b. The differential between Gate Voltage 250 and Output Voltage 265 is required for proper operation of MOS Power Transistor 255.

If Drive Command Input 205 then returns to logic low, shown at time T1, switch Single-pole Single-throw Switch 210 will open, First Constant-current Source 215 cannot charge Slew-rate Capacitor 230, and Second Constant-current Source 220 acts to discharge Slew-rate Capacitor 230. Therefore Slew-rate Capacitor Voltage 235 will decrease, and Gate Voltage 250 will follow. When Gate Voltage 250 is approximately equal to Output Voltage 265, Output Voltage 265 will follow Slew-rate Capacitor Voltage 235. This is shown in Waveform B of FIG. 2b for time >T1. If Drive Command Input 205 remains at logic low, Gate Voltage 250 and Output Voltage 265 will decrease to and remain at zero as discussed previously. The problem with this circuit is that Output Voltage 265 does not start to decrease until Gate Voltage 250 has decreased sufficiently. This represents an undesirable delay in the reduction of Output Voltage 265 (T2) with respect to the change of Drive Command Input 205 (T1), and in Waveform B is the quantity T2–T1.

With P-channel Transistor 225, Diode 290, Resistor 295, PNP Transistor 297 and Single-pole Double-throw Switch 240 now in the circuit, as shown, when Drive Command Input 205 goes to logic high Single-pole Single-throw Switch 210 conducts and First Constant-current Source 215 delivers current to charge Slew-rate Capacitor 230 at the same time Second Constant-current Source 220 is acting to discharge Slew-rate Capacitor 230. The circuit is designed so that the magnitude of First Constant-current Source 215 is greater than the magnitude of Second Constant-current Source 220, so that there is a net positive charging current delivered to Slew-rate Capacitor 230. There is no current through P-channel Transistor 225 because its gate and source are connected through Single-pole Double-throw Switch 240. Slew-rate Capacitor Voltage 235, Gate Voltage 250 and Output Voltage 265 all increase, as before. Refer to Waveform C, which shows that Output Voltage 265 and Gate Voltage 250 both increase until Output Voltage 265 is limited by Supply Voltage Source 285. Gate Voltage 250 will increase until it becomes limited by Charge-pump Voltage Source 180 and, to some extent, the ability of Operational Amplifier 245 to drive in a positive direction. For purposes of illustration, assume that the output of Operational Amplifier 245 may increase, when going positive, to Charge-pump Voltage Source 280. The slope of Gate Voltage 250 may change after Output Voltage 265 becomes limited by Supply Voltage Source 285 as illustrated by Waveform C of FIG. 2b. The differential between Gate Voltage 250 and Output Voltage 265 is required for proper operation of MOS Power Transistor 255.

If Drive Command Input 205 then returns to logic low, as shown at time T1, switch Single-pole Single-throw Switch 210 will open, First Constant-current Source 215 will not charge Slew-rate Capacitor 230, and Second Constant-current Source 220 acts to discharge Slew-rate Capacitor 230. However, the gate voltage of P-channel Transistor 225 now becomes equal to Supply Voltage Source 285 because Drive Command Input 205 changes the state of Single-pole Double-throw Switch 240. This causes P-channel Transistor 225 to conduct to ground, so that Slew-rate Capacitor 230 is discharged quickly until Slew-rate Capacitor Voltage 235 is reduced to a value approximately equal to Supply Voltage Source 285. At that point P-channel Transistor 225 again becomes non-conductive, and the discharge of Slew-rate Capacitor 230 proceeds as in the previous paragraph. Referring to Waveform C of FIG. 2b, it can be seen that the charging and holding characteristics of the circuit are unchanged from those described in the previous paragraph. The difference occurs when Drive Command Input 205 changes to a logic low and Slew-rate Capacitor Voltage 235 and Gate Voltage 250 are very quickly reduced in magnitude, thereby overcoming the T1–T2 delay disadvantage of the standard circuit. The rate of change in Gate Voltage 250 at time T1 is limited only by the slew rate of the current boost circuit composed of Diode 290, Resistor 295, and PNP Transistor 297. This circuit can be designed to provide significantly more output current capability than ordinarily available by Operational Amplifier 245 alone. Note that since Slew-rate Capacitor 230 is typically a small capacitor, P-channel Transistor 225 may be a small transistor.

As previously described, the magnitude of First Constant-current Source 215 is greater than the magnitude of Second Constant-current Source 220 so that a net positive charging current is delivered to Slew-rate Capacitor 230 when Drive Command Input 205 goes to a logic high. It will be recognized by one of ordinary skill in the art that when Drive Command Input 205 is a logic high, the charging of Slew-rate Capacitor 230 may be accomplished by only one current source, without the need for subtraction of a smaller current source from a larger current source. To accomplish this implementation, when Drive Command Input 205 is a high logic state, smaller current source 220 could be turned off by a switch or other means, not shown, thereby allowing First Constant-current Source 215 to solely charge Slew-rate Capacitor 230. This arrangement has the same effect without the need for the subtraction of a discharging current source from a charging current source to render an overall charging of Slew-rate Capacitor 230.

Additionally, it is understood that rather than Slew-rate Capacitor 230 being charged and discharged by First Constant-current Source 215 and Second Constant-current Source 220, respectively, it is conceived that Slew-rate Capacitor 230 may be charged and discharged by other sources of current such as by resistive elements or transistors, for instance.

Moreover, it is understood that while Slew-rate Capacitor 230 is coupled to ground potential in FIG. 2a, it may otherwise be connected to any arbitrary reference potential desired, including a positive or a negative reference voltage potential. Similarly, P-channel Transistor 225 is shown in FIG. 2a as being coupled to ground potential but it could also be connected to any arbitrary reference potential desired, including a positive or a negative reference voltage potential. For instance, P-channel Transistor 225 could be connected to Vcc, or any potential between Vcc and ground. It is further understood that Slew-rate Capacitor 230 and P-channel Transistor 225 may or may not be connected to the same reference voltage potential.

Figure 3A:
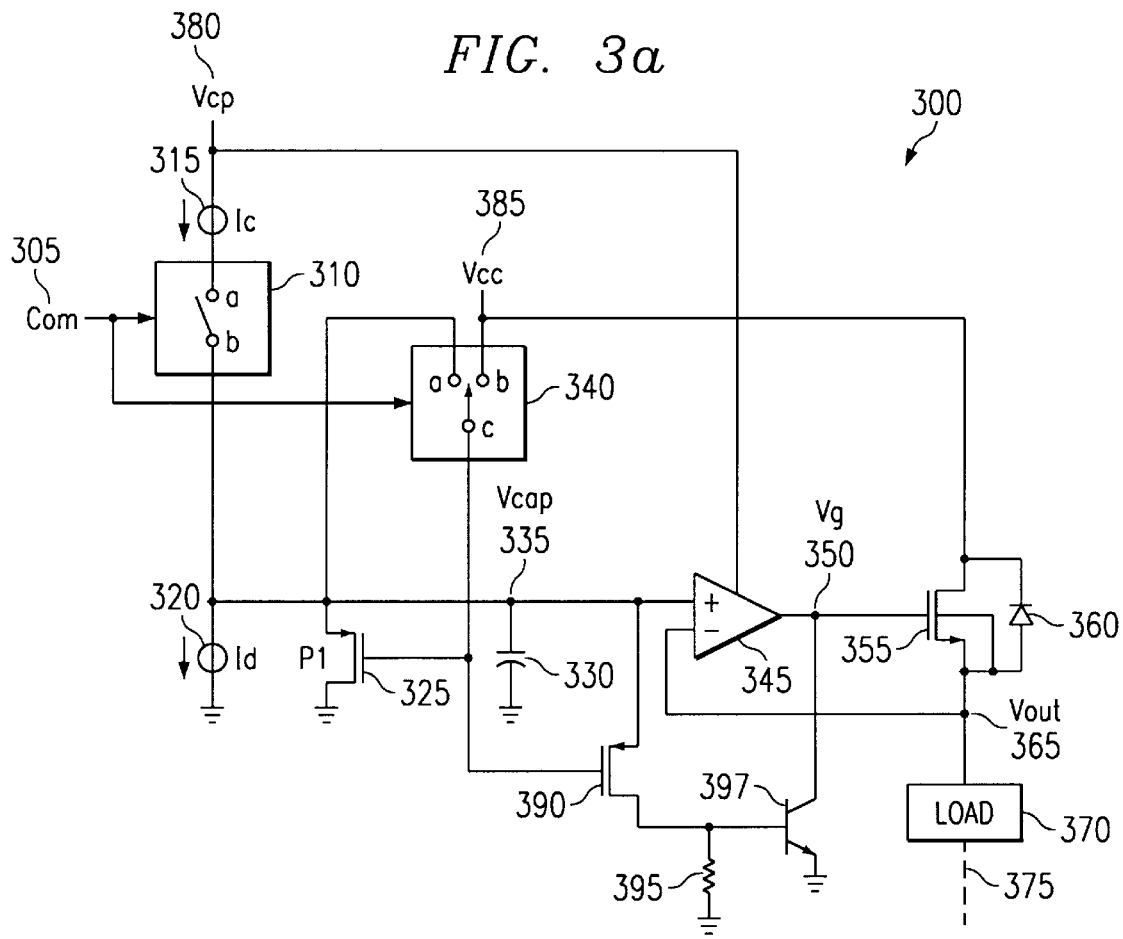
FIG. 3a and 3b disclose a Driver Circuit with Improved Slew Rate Control, according to a third embodiment of the present invention.
Figure 3B:
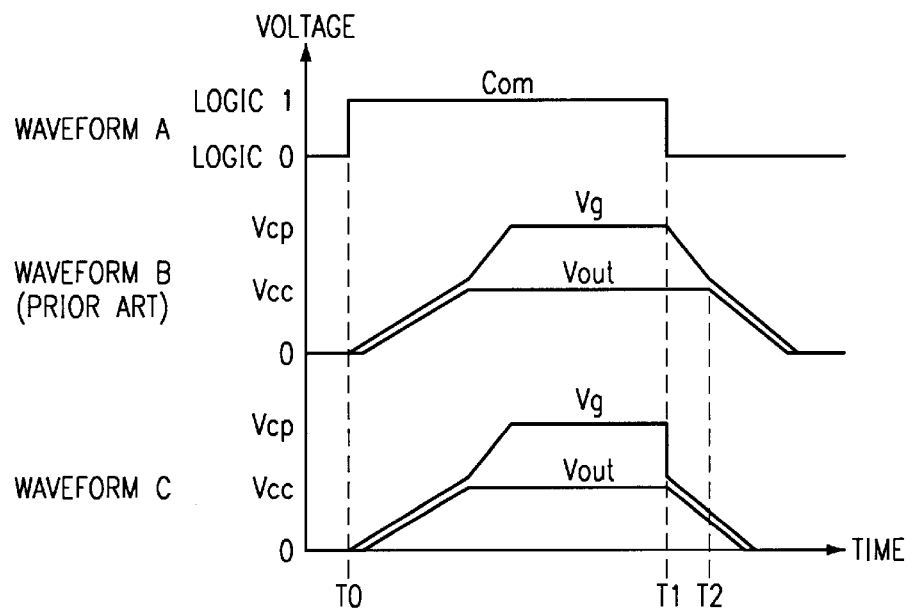

Referring now to FIGS. 3a and 3b, a third embodiment of the present invention, shown as schematic 300 and waveforms, is presented. Schematic 300 includes MOS Power Transistor 355, which in this example is a MOS transistor, and, more specifically, an N-channel DMOS transistor. DMOS transistors are known power devices, and MOS Power Transistor 355 is illustrated with Intrinsic Diode 360 between its body and drain as is typical.

MOS Power Transistor 355 has a controllable conduction path through a channel between its drain and source. A gate electrode serves as a control electrode for controlling conduction through this channel in response to Gate Voltage 350, as is well known. Gate Voltage 350 is generated by Operational Amplifier 345 and NPN Transistor 397.

In this example, MOS Power Transistor 355 is connected for selectively applying power to Load 370, which is above ground potential as indicated by Low-side Load Potential 375. This circuit is therefore referred to as a high side driver. The circumstances described in the background above show particular requirements of high side DMOS drivers that are to be improved, particularly where Load 370 is a set of inductive motor coils of multiple phases with additional high side driver circuits (not shown) all integrated with MOS Power Transistor 355 in the same chip.

MOS Power Transistor 355 receives Supply Voltage Source 385 from a first power supply connected to its drain. Supply Voltage Source 385 is typically from an external supply and is typically equal to 12 to 17 volts. The characteristics of DMOS devices like MOS Power Transistor 355 require a second voltage referred to as Charge-pump Voltage Source 380. Charge-pump Voltage Source 380 is at a voltage level higher than Supply Voltage Source 385, and may typically be 27 volts. Charge-pump Voltage Source 380 is typically generated by known means within the chip.

Charge-pump Voltage Source 380 is applied to Operational Amplifier 345 and First Constant-current Source 315. First Constant-current Source 315 supplies current to terminal a of Single-pole Single-throw Switch 310. Terminal b of Single-pole Single-throw Switch 310 is connected to Second Constant-current Source 320, First P-channel Transistor 325, terminal a of Single-pole Double-throw Switch 340, Slew-rate Capacitor 330, the source of Second P-channel Transistor 390, and the positive (non-inverting) input of Operational Amplifier 345. Second Constant-current Source 320 is connected between terminal b of Single-pole Single-throw Switch 310 and ground, and delivers current toward ground. The inverting input of Operational Amplifier 345 is connected to Output Voltage 365. The source of First P-channel Transistor 325 is connected between terminal b of Single-pole Single-throw Switch 310 and ground. The gate of First P-channel Transistor 325 is connected to terminal c of Single-pole Double-throw Switch 340 and to the gate of Second P-channel Transistor 390. Slew-rate Capacitor 330 is connected between terminal b of Single-pole Single-throw Switch 310 and ground. The drain of Second P-channel Transistor 390 is connected to the base of NPN Transistor 397 and to Resistor 395. The other end of Resistor 395 is grounded. The emitter of NPN Transistor 397 is connected to ground. The collector of NPN Transistor 397 is connected to the output of Operational Amplifier 345, and to the gate of MOS Power Transistor 355.

Single-pole Single-throw Switch 310 and Single-pole Double-throw Switch 340 are controlled by Drive Command Input 305. Drive Command Input 305 can be generated either externally or internal to the chip. When Drive Command Input 305 is at a logic level low Single-pole Single-throw Switch 310 is in the open condition, the terminal a of Single-pole Double-throw Switch 340 is conducting to terminal c of Single-pole Double-throw Switch 340 and the terminal b of Single-pole Double-throw Switch 340 is non-conducting. When Drive Command Input 305 is at a logic level high Single-pole Single-throw Switch 310 is in the conducting or shorted condition, Single-pole Double-throw Switch 340 is connected to the a terminal and P1 P-channel Transistor 325 is off. There is no connectivity between the a and b terminals of Single-pole Double-throw Switch 340 under any conditions.

The conductivity of the drain to source channel of P-channel Transistor 325 is controlled by the voltage differential present between the source and gate of P-channel Transistor 325. P1 P-channel Transistor 325 will conduct only when two conditions are met: first, Drive Command Input 305 must be a logic level low and second, Vout Output Voltage 365 must be a larger voltage than Vcc Supply Voltage Source 385. When Drive Command Input 305 is logic level high (1), terminal c of Single-pole Double-throw Switch 340 is connected to the terminal a of Single-pole Double-throw Switch 340 with the result that there is essentially no voltage differential between the gate and source of P-channel Transistor 325. Under this condition P-channel Transistor 325 never conducts and thus represents an open circuit between Slew-rate Capacitor Voltage 135 and ground. Conversely, when Drive Command Input 305 is logic level low, there is the possibility that P1 P-channel Transistor 325 will conduct if Vout Output Voltage 365 is higher than Vcc Supply Voltage Source 385. There is conductivity between the gate of P-channel Transistor 325 and Supply Voltage Source 385 because Single-pole Double-throw Switch 340 is conducting between its b terminal and c terminal. First P-channel Transistor 325 will remain conductive until Slew-rate Capacitor Voltage 335 reduces to a value approximately equal to Supply Voltage Source 385, since at that time the gate voltage of P-channel Transistor 325 will approximate that of Slew-rate Capacitor Voltage 335. During periods of discharge, Second P-channel Transistor 390 supplies base current to NPN Transistor 397 causing NPN Transistor 397 to conduct which reduces the gate voltage of MOS Power Transistor 355. Second P-channel Transistor 390 will supply base current until its gate and source voltage become approximately equal.

Basic operation of the circuit is as follows. When Drive Command Input 305 is at logic level low, Single-pole Single-throw Switch 310 is open. First Constant-current Source 315 therefore does not supply any charging current to Slew-rate Capacitor 330. Second Constant-current Source 320 has reduced the charge on Slew-rate Capacitor 330 to zero, and therefore Slew-rate Capacitor Voltage 335 is zero. The combination of Operational Amplifier 345, NPN Transistor 397, and MOS Power Transistor 355 is a voltage-follower circuit, and is well known in the art. Output Voltage 365 is therefore equal to Slew-rate Capacitor Voltage 335, which as mentioned is zero. Refer to Waveform A of FIG. 3b, which indicates that prior to time T0, Drive Command Input 305 is logic low, and Waveforms B and C which show that prior to time T0, Output Voltage 365 is zero.

With First P-channel Transistor 325, Second P-channel Transistor 390, Resistor 395, NPN Transistor 397 and Single-pole Double-throw Switch 340 removed from the drawing, the circuit functions as a typical slew rate controlled driver. When Drive Command Input 305 goes to logic high, Single-pole Single-throw Switch 310 conducts and First Constant-current Source 315 delivers current to charge Slew-rate Capacitor 330 at the same time Second Constant-current Source 320 is discharging Slew-rate Capacitor 330. The circuit is designed so that the magnitude of First Constant-current Source 315 is greater that that of Second Constant-current Source 320. There is therefore a net positive charging current delivered to Slew-rate Capacitor 330. As a result Slew-rate Capacitor Voltage 335, Gate Voltage 350 and Output Voltage 365 all increase. Refer to Waveform B of FIG. 3b, which shows that Output Voltage 365 and Gate Voltage 350 both increase until Output Voltage 365 is limited by Supply Voltage Source 385. Gate Voltage 350 will increase until it becomes limited by Charge-pump Voltage Source 380 and, to some extent, the ability of Operational Amplifier 145 to drive in a positive direction. For purposes of illustration, assume that the output of Operational Amplifier 345 may increase, when going positive, to Charge-pump Voltage Source 380. The slope of Gate Voltage 350 may change after Output Voltage 165 becomes limited by Supply Voltage Source 385 as illustrated by Waveform B of FIG. 3b. The differential between Gate Voltage 350 and Output Voltage 365 is required for proper operation of MOS Power Transistor 355.

If Drive Command Input 305 then returns to logic low, shown at time T1, switch Single-pole Single-throw Switch 310 will open, First Constant-current Source 315 cannot charge Slew-rate Capacitor 330, and Second Constant-current Source 320 acts to discharge Slew-rate Capacitor 330. Therefore Slew-rate Capacitor Voltage 335 will decrease, and Gate Voltage 350 will follow. When Gate Voltage 350 is approximately equal to Output Voltage 365, Output Voltage 365 will follow Slew-rate Capacitor Voltage 335. This is shown in Waveform B of FIG. 3b for time >T1. If Drive Command Input 305 remains at logic low, Gate Voltage 350 and Output Voltage 365 will decrease to and remain at zero as discussed previously. The problem with this circuit is that Output Voltage 365 does not start to decrease until Gate Voltage 350 has decreased sufficiently. This represents an undesirable delay in the reduction of Output Voltage 365 (T2) with respect to the change of Drive Command Input 305 (T1), and in Waveform B is the quantity T2−T1.

With First P-channel Transistor 325, Second P-channel Transistor 390, Resistor 395, NPN Transistor 397, and Single-pole Double-throw Switch 340 now in the circuit, as shown, when Drive Command Input 305 goes to logic high Single-pole Single-throw Switch 310 conducts and First Constant-current Source 315 delivers current to charge Slew-rate Capacitor 330 at the same time Second Constant-current Source 320 is acting to discharge Slew-rate Capacitor 330. The circuit is designed so that the magnitude of First Constant-current Source 315 is greater than the magnitude of Second Constant-current Source 320, so that there is a net positive charging current delivered to Slew-rate Capacitor 330. There is no current through First P-channel Transistor 325 or Second P-channel Transistor 390 because their respective gates and sources are connected together through Single-pole Double-throw Switch 340. Slew-rate Capacitor Voltage 335, Gate Voltage 350 and Output Voltage 365 all increase, as before. Refer to Waveform C of FIG. 3b, which shows that Output Voltage 365 and Gate Voltage 350 both increase until Output Voltage 365 is limited by Supply Voltage Source 385. Gate Voltage 350 will increase until it becomes limited by Charge-pump Voltage Source 380 and, to some extent, the ability of Operational Amplifier 345 to drive in a positive direction. For purposes of illustration, assume that the output of Operational Amplifier 345 may increase, when going positive, to Charge-pump Voltage Source 380. The slope of Gate Voltage 350 may change after Output Voltage 165 becomes limited by Supply Voltage Source 385 as illustrated by Waveform C of FIG. 3b. The differential between Gate Voltage 350 and Output Voltage 365 is required for proper operation of MOS Power Transistor 355.

If Drive Command Input 305 then returns to logic low, as shown at time T1, switch Single-pole Single-throw Switch 310 will open, First Constant-current Source 315 will not charge Slew-rate Capacitor 330, and Second Constant-current Source 320 acts to discharge Slew-rate Capacitor 330. However, the gate voltages of First P-channel Transistor 325 and Second P-channel Transistor 390 now become equal to Supply Voltage Source 385 because Drive Command Input 305 changes the state of Single-pole Double-throw Switch 340. This causes First P-channel Transistor 325 to conduct to ground and Second P-channel Transistor 390 to provide base current to NPN Transistor 397, so that Slew-rate Capacitor 330 is discharged quickly until Slew-rate Capacitor Voltage 335 is reduced to a value approximately equal to Supply Voltage Source 385. At that point First P-channel Transistor 325 and Second P-channel Transistor 390 again become non-conductive, and the discharge of Slew-rate Capacitor 330 proceeds as in the previous paragraph. When NPN Transistor 397 receives base current from Second P-channel Transistor 390 it conducts which serves to quickly lower the gate voltage of MOS Power Transistor 355. Referring to Waveform C of FIG. 3b, it can be seen that the charging and holding characteristics of the circuit are unchanged from those described in the previous paragraph. The difference occurs when Drive Command Input 305 changes to a logic low and Slew-rate Capacitor Voltage 335 and Gate Voltage 350 are very quickly reduced in magnitude, thereby overcoming the T1–T2 delay disadvantage of the standard circuit. The rate of change in Gate Voltage 350 at time T1 is limited only by the conduction capabilities of NPN Transistor 397, which will be selected or designed to reduce Gate Voltage 350 as rapidly as required. Note that since Slew-rate Capacitor 330 is typically a small capacitor, First P-channel Transistor 325 may be a small transistor.

As previously described, the magnitude of First Constant-current Source 315 is greater than the magnitude of Second Constant-current Source 320 so that a net positive charging current is delivered to Slew-rate Capacitor 330 when Drive Command Input 305 goes to a logic high. It will be recognized by one of ordinary skill in the art that when Drive Command Input 305 is a logic high, the charging of Slew-rate Capacitor 330 may be accomplished by only one current source, without the need for subtraction of a smaller current source from a larger current source. To accomplish this implementation, when Drive Command Input 305 is a high logic state, smaller current source 320 could be turned off by a switch or other means, not shown, thereby allowing First Constant-current Source 315 to solely charge Slew-rate Capacitor 330. This arrangement has the same effect without the need for the subtraction of a discharging current source from a charging current source to render an overall charging of Slew-rate Capacitor 330.

Additionally, it is understood that rather than Slew-rate Capacitor 330 being charged and discharged by First Constant-current Source 315 and Second Constant-current Source 320, respectively, it is conceived that Slew-rate Capacitor 330 may be charged and discharged by other sources of current such as by resistive elements or transistors, for instance.

Moreover, it is understood that while Slew-rate Capacitor 330 is coupled to ground potential in FIG. 3a, it may otherwise be connected to any arbitrary reference potential desired, including a positive or a negative reference voltage potential. Similarly, P-channel Transistor 325 is shown in FIG. 3a as being coupled to ground potential but it could also be connected to any arbitrary reference potential desired, including a positive or a negative reference voltage potential. For instance, P-channel Transistor 325 could be connected to Vcc, or any potential between Vcc and ground. It is further understood that Slew-rate Capacitor 330 and P-channel Transistor 325 may or may not be connected to the same reference voltage potential.

Figure 4A:
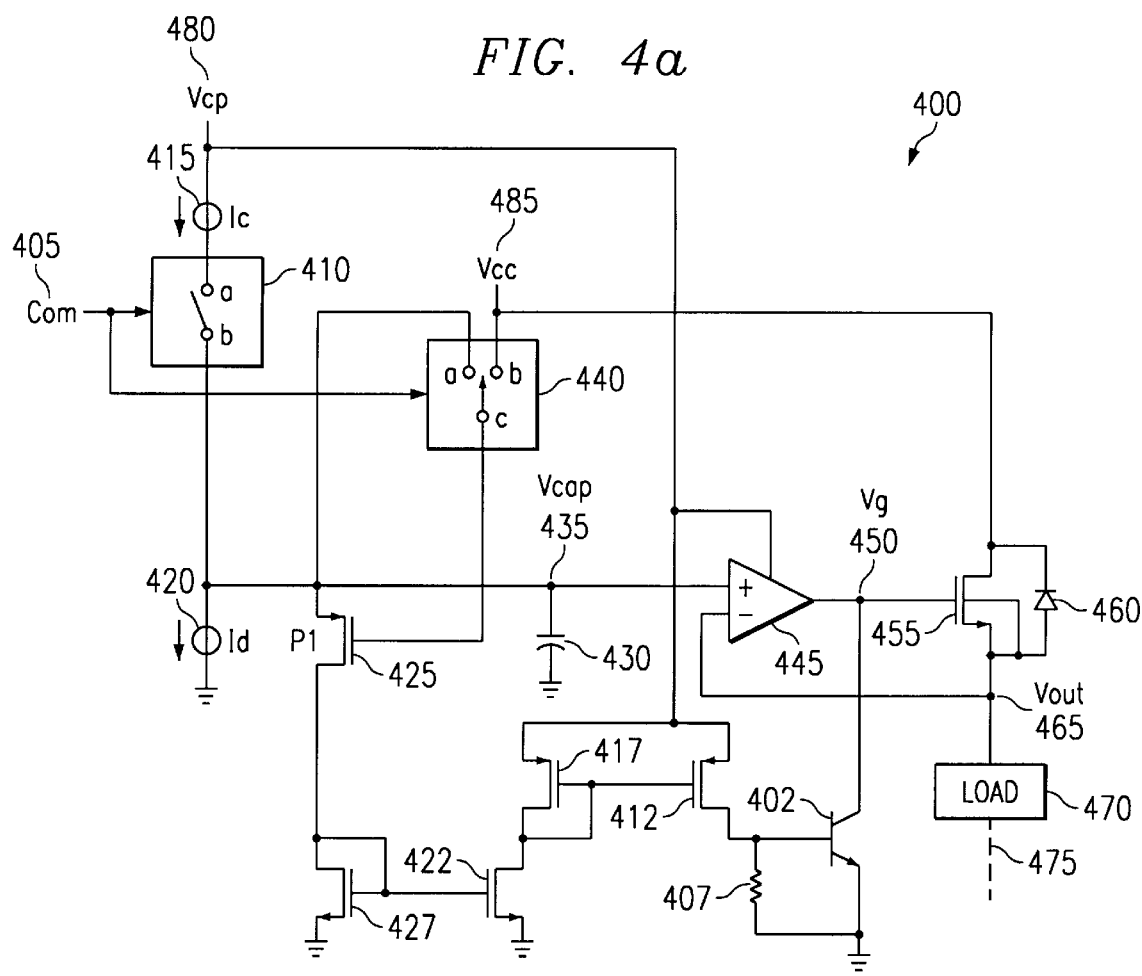
FIG. 4a and 4b disclose a Driver Circuit with Improved Slew Rate Control, according to a fourth embodiment of the present invention.
Figure 4B:
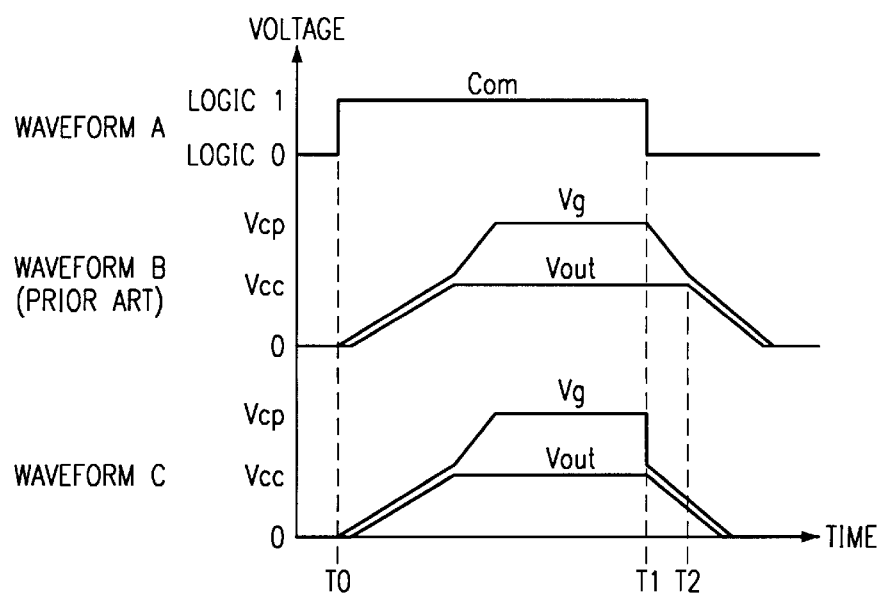

Referring now to FIGS. 4a and 4b, a fourth embodiment of the present invention, shown as schematic 400 and waveforms, is presented. Schematic 400 includes MOS Power Transistor 455, which in this example is a MOS transistor, and, more specifically, an N-channel DMOS transistor. DMOS transistors are known power devices, and MOS Power Transistor 455 is illustrated with Intrinsic Diode 460 between its body and drain as is typical.

MOS Power Transistor 455 has a controllable conduction path through a channel between its drain and source. A gate electrode serves as a control electrode for controlling conduction through this channel in response to Gate Voltage 450, as is well known. Gate Voltage 450 is generated by Operational Amplifier 445 and NPN Transistor 402.

In this example, MOS Power Transistor 455 is connected for selectively applying power to Load 470, which is above ground potential as indicated by Low-side Load Potential 475. This circuit is therefore referred to as a high side driver. The circumstances described in the background above show particular requirements of high side DMOS drivers that are to be improved, particularly where Load 470 is a set of inductive motor coils of multiple phases with additional high side driver circuits (not shown) all integrated with MOS Power Transistor 455 in the same chip.

MOS Power Transistor 455 receives Supply Voltage Source 485 from a first power supply connected to its drain. Supply Voltage Source 485 is typically from an external supply and is typically equal to 12 to 17 volts. The characteristics of DMOS devices like MOS Power Transistor 455 require a second voltage referred to as Charge-pump Voltage Source 480. Charge-pump Voltage Source 480 is at a voltage level higher than Supply Voltage Source 485, and may typically be 27 volts. Charge-pump Voltage Source 480 is typically generated by known means within the chip.

Charge-pump Voltage Source 480 is applied to Operational Amplifier 445 and First Constant-current Source 415. First Constant-current Source 415 supplies current to terminal a of Single-pole Single-throw Switch 410. Terminal b of Single-pole Single-throw Switch 410 is connected to Second Constant-current Source 420, First P-channel Transistor 425, terminal a of Single-pole Double-throw Switch 440, Slew-rate Capacitor 430 and the positive (non-inverting) input of Operational Amplifier 445. Second Constant-current Source 420 is connected between terminal b of Single-pole Single-throw Switch 410 and ground, and delivers current toward ground. The inverting input of Operational Amplifier 445 is connected to Output Voltage 465. The source of First P-channel Transistor 425 is connected to terminal b of Single-pole Single-throw Switch 410. The drain of First N-channel Transistor 427 is connected to the gate of First N-channel Transistor 427, to the drain of First P-channel Transistor 425, and to the gate of Second N-channel Transistor 422. The source of First N-channel Transistor 427 is connected to ground. The source of Second N-channel Transistor 422 is connected to ground, and the drain of Second N-channel Transistor 422 is connected to the drain of Second P-channel Transistor 417, the gate of Second P-channel Transistor 417, and the gate of Third P-channel Transistor 412. The source of Second P-channel Transistor 417 is connected to Charge-pump Voltage 480 and to the source of Third P-channel Transistor 412. The drain of Third P-channel Transistor 412 is connected to the base of NPN Transistor 402 and to one end of Resistor 407. The other end of Resistor 407 is connected to ground. The emitter of NPN Transistor 402 is connected to ground, and the collector of NPN Transistor 402 is connected to the gate of MOS Power Transistor 455. The gate of First P-channel Transistor 425 is connected to the c terminal of Single-pole Double-throw Switch 440. Slew-rate Capacitor 430 is connected between terminal b of Single-pole Single-throw Switch 410 and ground.

Single-pole Single-throw Switch 410 and Single-pole Double-throw Switch 440 are controlled by Drive Command Input 405. Drive Command Input 405 can be generated either externally or internal to the chip. When Drive Command Input 405 is at a logic level low Single-pole Single-throw Switch 410 is in the open condition, terminal a of Single-pole Double-throw Switch 440 is conducting to terminal c of Single-pole Double-throw Switch 440 and terminal b of Single-pole Double-throw Switch 440 is non-conducting. When Drive Command Input 405 is at a logic level high Single-pole Single-throw Switch 410 is in the conducting or shorted condition, the Single-pole Double-throw Switch 440 is connected to the a terminal and First P-channel Transistor 425 is off. There is no connectivity between the a and b terminals of Single-pole Double-throw Switch 440 under any conditions The conductivity of the drain to source channel of First P-channel Transistor 425 is controlled by the voltage differential present between the source and gate of First P-channel Transistor 425. First P1 P-channel Transistor 425 will conduct only when two conditions are met: first, Drive Command Input 405 must be a logic level low and second, Vout Output Voltage 465 must be a larger voltage than Vcc Supply Voltage Source 485. When Drive Command Input 405 is logic level high (1), terminal c of Single-pole Double-throw Switch 440 is connected to the first terminal a of Single-pole Double-throw Switch 440 with the result that there is essentially no voltage differential between the gate and source of First P-channel Transistor 425. Under this condition First P-channel Transistor 425 never conducts and thus represents an open circuit between Slew-rate Capacitor Voltage 435 and ground. Conversely, when Drive Command Input 405 is logic level low, there is the possibility that P1 First P-channel Transistor 425 will conduct if Vout Output Voltage 465 is higher than Vcc Supply Voltage Source 485. There is conductivity between the gate of First P-channel Transistor 425 and Supply Voltage Source 485 because Single-pole Double-throw Switch 440 is conducting between its b and c terminals. First P-channel Transistor 425 and First N-channel Transistor 427 will both remain conductive until Slew-rate Capacitor Voltage 435 reduces to a value approximately equal to Supply Voltage Source 485, since at that time the gate voltage of First P-channel Transistor 425 will approximate that of Slew-rate Capacitor Voltage 435. First N-channel Transistor 427 and Second N-channel Transistor 422 constitute a first current mirror, wherein the drain current of Second N-channel Transistor 422 is directly related to the drain current of First N-channel Transistor 427. Second P-channel Transistor 417 and Third P-channel Transistor 412 constitute a second current mirror, wherein the drain current of Third P-channel Transistor 412 is directly related to the drain current of Second P-channel Transistor 417. Third P-channel Transistor 412 is utilized to provide base current for NPN Transistor 402. The conductivity between the collector and emitter of NPN Transistor 402 is related to its base current, which is related to the capacitor discharge current flowing through First P-channel Transistor 425.

Basic operation of the circuit is as follows. When Drive Command Input 405 is at logic level low, Single-pole Single-throw Switch 410 is open. First Constant-current Source 415 therefore does not supply any charging current to Slew-rate Capacitor 430. Second Constant-current Source 420 has reduced the charge on Slew-rate Capacitor 430 to zero, and therefore Slew-rate Capacitor Voltage 435 is zero. The combination of Operational Amplifier 445, NPN Transistor 402 and MOS Power Transistor 455 is a voltage-follower circuit arrangement, and is well known in the art. Output Voltage 465 is therefore equal to Slew-rate Capacitor Voltage 435, which as mentioned is zero. Refer to Waveform A of FIG. 4b, which indicates that prior to time T0, Drive Command Input 405 is logic low, and Waveforms B and C which show that prior to time T0, Output Voltage 465 is zero.

With First P-channel Transistor 425, First N-channel Transistor 427, Second N-channel Transistor 422,Second P-channel Transistor 417, Third P-channel Transistor 412 Resistor 407, NPN Transistor 402, and Single-pole Double-throw Switch 440 removed from the drawing, the circuit functions as a typical slew rate controlled driver. When Drive Command Input 405 goes to logic high, Single-pole Single-throw Switch 410 conducts and First Constant-current Source 415 delivers current to charge Slew-rate Capacitor 430 at the same time Second Constant-current Source 420 is discharging Slew-rate Capacitor 430. The circuit is designed so that the magnitude of First Constant-current Source 415 is greater that that of Second Constant-current Source 420. There is therefore a net positive charging current delivered to Slew-rate Capacitor 430. As a result Slew-rate Capacitor Voltage 435, Gate Voltage 450 and Output Voltage 465 all increase. Refer to Waveform B of FIG. 4b, which shows that Output Voltage 465 and Gate Voltage 450 both increase until Output Voltage 465 is limited by Supply Voltage Source 485. Gate Voltage 450 will increase until it becomes limited by Charge-pump Voltage Source 480 and, to some extent, the ability of Operational Amplifier 445 to drive in a positive direction. For purposes of illustration, assume that the output of Operational Amplifier 445 may increase, when going positive, to Charge-pump Voltage Source 480. The slope of Gate Voltage 450 may change after Output Voltage 465 becomes limited by Supply Voltage Source 485 as illustrated by Waveform B of FIG. 4b. The differential between Gate Voltage 450 and Output Voltage 465 is required for proper operation of MOS Power Transistor 455.

If Drive Command Input 405 then returns to logic low, shown at time T1, switch Single-pole Single-throw Switch 410 will open, First Constant-current Source 415 cannot charge Slew-rate Capacitor 430, and Second Constant-current Source 420 acts to discharge Slew-rate Capacitor 430. Therefore Slew-rate Capacitor Voltage 435 will decrease, and Gate Voltage 450 will follow. When Gate Voltage 450 is approximately equal to Output Voltage 465, Output Voltage 465 will follow Slew-rate Capacitor Voltage 435. This is shown in Waveform B for time >T1. If Drive Command Input 405 remains at logic low, Gate Voltage 450 and Output Voltage 465 will decrease to and remain at zero as discussed previously. The problem with this circuit is that Output Voltage 465 does not start to decrease until Gate Voltage 450 has decreased sufficiently. This represents an undesirable delay in the reduction of Output Voltage 465 (T2) with respect to the change of Drive Command Input 405 (T1), and in Waveform B is the quantity T2−T1.

With First P-channel Transistor 425, First N-channel Transistor 427, Second N-channel Transistor 422, Second P-channel Transistor 417, Third P-channel Transistor 412, Resistor 407, NPN Transistor 402 and Single-pole Double-throw Switch 440 now in the circuit, as shown, when Drive Command Input 405 goes to logic high Single-pole Single-throw Switch 410 conducts and First Constant-current Source 415 delivers current to charge Slew-rate Capacitor 430 at the same time Second Constant-current Source 420 is acting to discharge Slew-rate Capacitor 430. The circuit is designed so that the magnitude of First Constant-current Source 415 is greater than the magnitude of Second Constant-current Source 420, so that there is a net positive charging current delivered to Slew-rate Capacitor 430. There is no current through First P-channel Transistor 425 because its gate and source are connected through Single-pole Double-throw Switch 440. There is therefore no current through First N-channel Transistor 427, Second N-channel Transistor 422, Second P-channel Transistor 417, Third P-channel Transistor 412 or NPN Transistor 402. Slew-rate Capacitor Voltage 435, Gate Voltage 450 and Output Voltage 465 will all increase, as before. Refer to Waveform C, which shows that Output Voltage 465 and Gate Voltage 450 both increase until Output Voltage 465 is limited by Supply Voltage Source 485. Gate Voltage 450 will increase until it becomes limited by Charge-pump Voltage Source 480 and, to some extent, the ability of Operational Amplifier 445 to drive in a positive direction. For purposes of illustration, assume that the output of Operational Amplifier 445 may increase, when going positive, to Charge-pump Voltage Source 480. The slope of Gate Voltage 150 may change after Output Voltage 465 becomes limited by Supply Voltage Source 185 as illustrated by Waveform C of FIG. 4b. The differential between Gate Voltage 450 and Output Voltage 465 is required for proper operation of MOS Power Transistor 455.

If Drive Command Input 405 then returns to logic low, as shown at time T1, switch Single-pole Single-throw Switch 410 will open, First Constant-current Source 415 will not charge Slew-rate Capacitor 430, and Second Constant-current Source 420 acts to discharge Slew-rate Capacitor 430. However, the gate voltage of First P-channel Transistor 425 now becomes equal to Supply Voltage Source 485 because Drive Command Input 405 changes the state of Single-pole Double-throw Switch 440. This causes First P-channel Transistor 425 to conduct through First N-channel Transistor 427 to ground, so that Slew-rate Capacitor 430 is discharged quickly until Slew-rate Capacitor Voltage 435 is reduced to a value approximately equal to Supply Voltage Source 485. At that point First P-channel Transistor 425 again becomes non-conductive, and the discharge of Slew-rate Capacitor 430 proceeds as in the previous paragraph. Referring to Waveform C of FIG. 4b, it can be seen that the charging and holding characteristics of the circuit are unchanged from those described in the previous paragraph. The difference occurs when Drive Command Input 405 changes to a logic low and Slew-rate Capacitor Voltage 435 and Gate Voltage 450 are very quickly reduced in magnitude, thereby overcoming the T1−T2 delay disadvantage of the standard circuit. The rate of change in Gate Voltage 450 at time T1 is limited only by the slew rate of NPN Transistor 402, which will be selected or designed to reduce Gate Voltage 450 as rapidly as required. When First N-channel Transistor 427 conducts drain current, the combination of Second N-channel Transistor 422, Second P-channel Transistor 417 and Third P-channel Transistor 412 provide base current to NPN Transistor 402. Note that since Slew-rate Capacitor 430 is typically a small capacitor, First P-channel Transistor 425 may be a small transistor.

Another embodiment similar to FIG. 4 calls for eliminating transistors 412, 417, 422, and 427 while retaining Resistor 407. This would have the effect of a direct connection from the drain of P-channel Transistor 425 to the base of NPN Transistor 402. While the gain of such a configuration would not be as great as with the configuration of FIG. 4, it does utilize less components and therefore is somewhat cheaper to make.

As previously described, the magnitude of First Constant-current Source 415 is greater than the magnitude of Second Constant-current Source 420 so that a net positive charging current is delivered to Slew-rate Capacitor 430 when Drive Command Input 405 goes to a logic high. It will be recognized by one of ordinary skill in the art that when Drive Command Input 405 is a logic high, the charging of Slew-rate Capacitor 430 may be accomplished by only one current source, without the need for subtraction of a smaller current source from a larger current source. To accomplish this implementation, when Drive Command Input 405 is a high logic state, smaller current source 420 could be turned off by a switch or other means, not shown, thereby allowing First Constant-current Source 415 to solely charge Slew-rate Capacitor 430. This arrangement has the same effect without the need for the subtraction of a discharging current source from a charging current source to render an overall charging of Slew-rate Capacitor 430.

Additionally, it is understood that rather than Slew-rate Capacitor 430 being charged and discharged by First Constant-current Source 415 and Second Constant-current Source 420, respectively, it is conceived that Slew-rate Capacitor 430 may be charged and discharged by other sources of current such as by resistive elements or transistors, for instance.

Moreover, it is understood that while Slew-rate Capacitor 430 is coupled to ground potential in FIG. 4a, it may otherwise be connected to any arbitrary reference potential desired, including a positive or a negative reference voltage potential. Similarly, P-channel Transistor 425 is shown in FIG. 4a as being coupled to ground potential but it could also be connected to any arbitrary reference potential desired, including a positive or a negative reference voltage potential. For instance, P-channel Transistor 425 could be connected to Vcc, or any potential between Vcc and ground. It is further understood that Slew-rate Capacitor 430 and P-channel Transistor 425 may or may not be connected to the same reference voltage potential.

Figure 5:
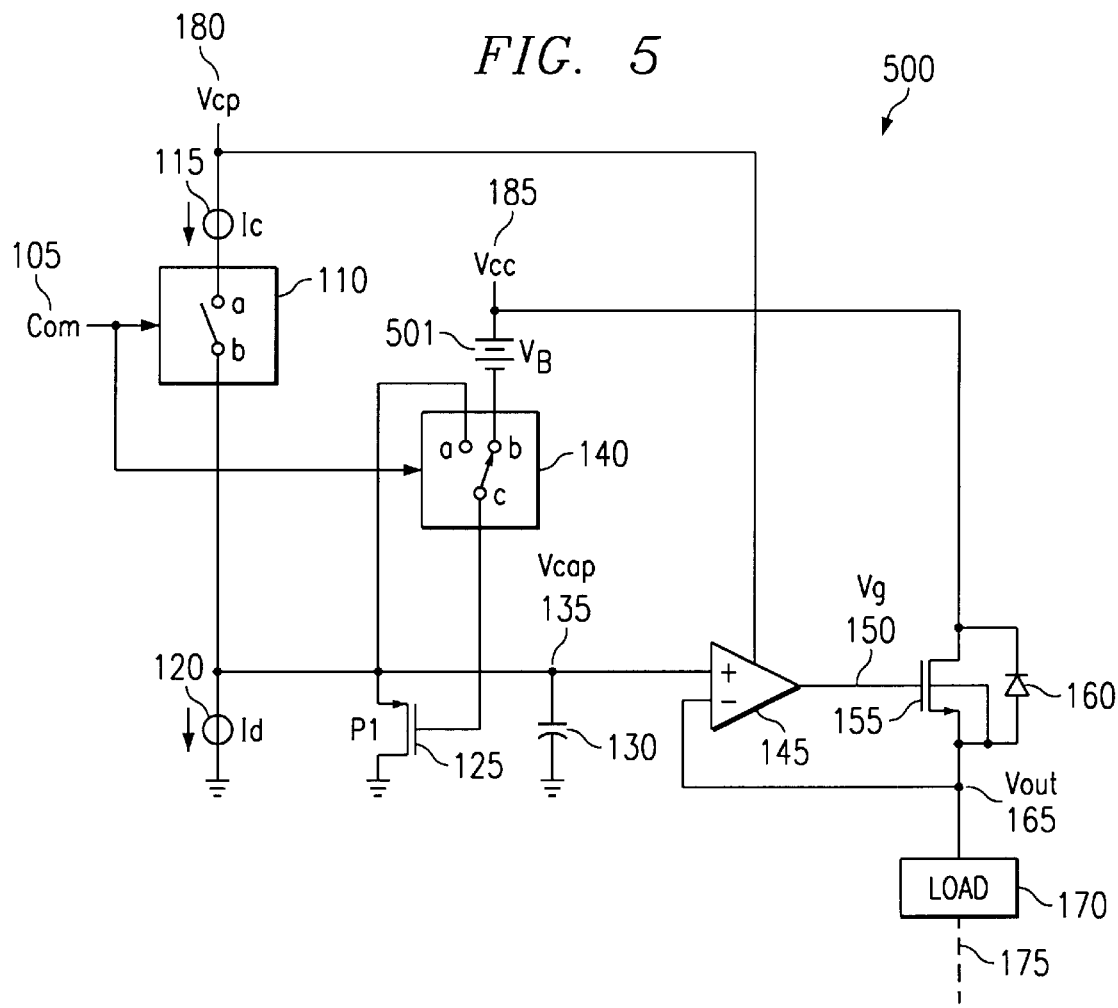
FIG. 5 is an improvement of the Driver Circuit with Improved Slew Rate Control, according to the present invention.
Figure 6:
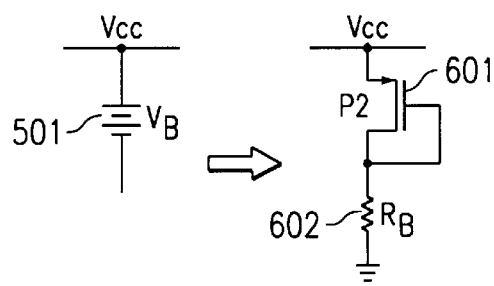
FIG. 6 illustrates an electrical equivalent of the VB voltage 501 of FIG. 5, according to the present invention.

Of concern in each of the embodiments disclosed in FIGS. 1a, 2a, 3a, and 4a, is the situation in which the p-channel transistor P1 shuts off due to the Vt, or threshold voltage, of the transistor itself. Such a response by the p-channel transistor P1 is an error and this defect may be addressed by referencing the gate of the p-channel transistor P1 to a voltage potential that is less than Vcc by one p-channel diode drop. This improvement is illustrated in FIG. 5, an improvement 500 of the Driver Circuit with Improved Slew Rate Control of FIG. 1. Referring now to FIG. 5, the gate of P-channel Transistor P1 125 is connected through terminal b of Single-pole Double-throw Switch 140 to VB voltage 501. VB Voltage 501 may be any arbitrary voltage, including zero volts. It is preferable that VB voltage 501 is equal to the gate to source voltage, VGS, of P-channel Transistor P1. A practical way to realize VB voltage 501 is illustrated in FIG. 6. RB resistor 602 pulls a predetermined amount of current through P2 transistor 601 to ground potential, thereby establishing a voltage at switch terminal b of Single-pole Double-throw Switch 140 that is equal to Vcc less VTP. In this way, the voltage which P-channel Transistor P1 126 switches is equal to reference voltage Vcc. Alternately, more accurate comparators could also be used to more exactly ensure that the voltage at which P-channel Transistor P1 125 switches is equal to Vcc.

It is understood that the improvement of FIGS. 5 and 6 could be used in the same manner in the embodiments of FIGS. 2a, 3a, and 4a to address the concern of an error when the P1 transistor shuts off due to its threshold voltage.

As can be seen from the foregoing description the present invention teaches four embodiments of drive circuits that include pre-slewing but have novel methods of rate control.

The first embodiment teaches a method for forcing a faster discharge of the slew-rate capacitor by the addition of one electronic switch and one transistor. This method presupposes that the amplifier driving the gate of the power device has acceptable slew rate characteristics for the application.

The second embodiment utilizes the methods of the first embodiment in conjunction with a circuit which provides high slew rate capability so that amplifier slew rate requirements are minimized.

The third embodiment teaches a modification to the method of the first embodiment so that a transistor, using circuitry novel to this invention, is utilized to provide the high slew rate capability so that amplifier slew rate requirements are minimized.

The fourth embodiment teaches another modification to the methods of the first embodiment so that a transistor, under control of circuitry novel to this invention, is utilized to provide5 the high slew rate capability so that amplifier slew rate requirements are minimized. Discharge of the gate voltage of the power device is to the supply voltage.

While the invention has been particularly shown and described with reference to a preferred embodiment, it will be understood by those skilled in the art that various changes in form and detail may be made therein without departing from the spirit and scope of the invention.

What is claimed is:

1. A driver circuit having a slew rate control system, comprising:

a charging source of current having a first terminal and a second terminal, with the first terminal coupled to a first reference voltage;

a discharging source of current having a first terminal and a second terminal, with the second terminal coupled to a second reference voltage;

a first switch, having a first terminal and a second terminal and being provided with a control signal, with the first terminal of the first switch coupled to the second terminal of the charging source of current and with the second terminal of the first switch coupled to the first terminal of the discharging source of current;

a second switch, having a first terminal, a second terminal, a third terminal, and the control signal as an input signal, with the first terminal of the second switch coupled to the first terminal of the discharging source of current and the second terminal of the second switch coupled to a third reference voltage characterized as having a lower magnitude of voltage than the first reference voltage;

a first conductive device having a controllable conduction path, with a first terminal of the first conductive device coupled to the first terminal of the discharging source of current and the first terminal of the second switch, a second terminal coupled to a conductive device reference voltage, and a control terminal coupled to the third terminal of the second switch;

a capacitive element having a first terminal coupled to the first terminal of the discharging source of current, the first terminal of the first switch, the first terminal of the first conductive device, and the first terminal of the second switch and having a second terminal coupled to a capacitive element reference voltage;

an amplifier having a first input terminal, a second input terminal and an output terminal, with the first input terminal coupled to a node at the first input terminal formed by the coupling of the first terminal of the capacitive element, the first terminal of the conducting element, the first terminal of the second switch, the first terminal of the discharging source of current, and the first terminal of the first switch, wherein the second input terminal is an inverting input terminal, the first reference voltage is applied to the amplifier, and the amplifier generates a voltage on the output terminal;

a power device, having a control terminal, a first terminal, a second terminal and characterized as having a conduction path between the first terminal and the second terminal, wherein the control terminal receives the voltage generated by the amplifier and controls conduction of the power device, the first terminal is coupled to the third reference voltage, the second terminal is coupled to the second input terminal of the amplifier, and an output voltage of the power device is resident on the second terminal of said power device, wherein the first conductive device conducts only when the control signal is the first logic level and the voltage generated by the amplifier is larger than the third reference voltage and the first conductive device will conduct until the voltage at the node at the first input terminal of the amplifier is reduced to be approximately equal to the third reference voltage, wherein when the control signal transitions from the first logic level to the second logic level the first switch conducts, the charging source of current delivers a charging current to the capacitive element, the output voltage generated by the power device increases to the third reference voltage, and a voltage on the control terminal of the power device increases to the first reference voltage, and wherein when the control signal transitions from the second logic level to the first logic level, the first switch does not conduct, the charging source of current will not charge the capacitive element, the first conductive device conducts so long as the output voltage generated by the power device is larger than the third reference voltage, and the discharging source of current operates to quickly discharge the capacitive element so that the voltage at the node at the first input terminal of the amplifier is quickly reduced until the voltage at the node is approximately equal to the third reference voltage.

2. The circuit of claim 1, wherein the conductive device reference voltage is equal to the second reference voltage.

3. The circuit of claim 1, wherein the capacitive element reference voltage is equal to the second reference voltage.

4. The circuit of claim 1, wherein the first source of current is a first constant current source and the second source of current is a second constant current source.

5. The circuit of claim 1, wherein the rate of reduction of the voltage on the control terminal of the power device is limited by the slew rate of the amplifier.

6. The circuit of claim 1, wherein the first conductive device is a first transistor and the driver circuit further comprises:

a voltage source interposed between the second switch and the third reference voltage that is equal to the third reference voltage less the threshold voltage of the first transistor and that prevents the first transistor from shutting off due to the threshold voltage of the first transistor, wherein the second terminal of the second switch is referenced to the voltage source.

7. The circuit of claim 6, wherein the voltage source comprises:

a second transistor coupled to the third reference voltage; and a resistive element connected in series to the second transistor and coupled to the second reference voltage.

8. The circuit of claim 1, further comprising:

a high current drive circuit coupled to the amplifier and the power device that facilitates the reduction of the voltage at the node at the first input terminal of the amplifier to the third reference voltage when the control signal transitions from the second logic level to the first logic level.

9. The circuit of claim 8, wherein the high current drive circuit comprises:

a diode element;

a resistive element; and a conductive element, with the diode element, the resistive element, and the conductive element connected in parallel between the amplifier and the power device.

10. The circuit of claim 8, wherein the rate of reduction of the voltage on the control terminal of the power device is limited by the high current drive circuit.

11. The circuit of claim 1, further comprising:

a second conductive device having a controllable conduction path, with a first terminal coupled to the first terminal of the amplifier, a second terminal, and a control terminal coupled to the control terminal of the first conductive device, and the third terminal of the second switch;

a resistive element with a first terminal coupled to the second terminal of the second conductive device and a second terminal coupled to the second reference voltage; and a third conductive device having a controllable conduction path, with a first terminal coupled to the control terminal of the power device, a second terminal coupled to the second reference voltage, and a control terminal coupled to the first terminal of the resistive element and the second terminal of the second conductive device, wherein when the control signal transitions from the second logic level to the first logic level, the second conductive device supplies current to the control terminal of the third conductive device causing the third conductive device to conduct to reduce the voltage on the control terminal of the power device.

12. The circuit of claim 11, wherein the rate of reduction of the voltage on the control terminal of the power device is limited by the third conductive device.

13. The circuit of claim 1, further comprising:

a first current mirror coupled to the second terminal of the first conductive element and the second reference voltage;

a second current mirror coupled to the first current mirror and the second reference voltage;

a transistor element coupled to the second current mirror, the voltage on the control terminal of the power device and the second reference voltage; and a resistive element coupled to the second current mirror, the transistor element, and the second reference voltage, wherein when the control signal transitions from the second logic level to the first logic level, the first current mirror conducts so long as the voltage on the node is larger than the third reference voltage and the first current mirror and the second current mirror operate to provide current to the control terminal of the transistor element.

14. The circuit of claim 13, wherein the first current mirror comprises:

a second conductive device having a controllable conduction path, with a first terminal coupled to the second terminal of the first conductive device, a second terminal coupled to the second reference voltage, and a control terminal coupled to the first terminal and the second terminal of the first conductive device; and a third conductive device having a controllable conduction path, with a first terminal, a second terminal coupled to the second reference voltage, and a control terminal coupled to the control terminal of the second conductive device; and wherein the second current mirror comprises:

a fourth conductive device having a controllable conduction path, with a first terminal coupled to the first reference voltage, a second terminal coupled to the first terminal of the third conductive device, and a control terminal coupled to the second terminal; and a fifth conductive device having a controllable conduction path, with a first terminal coupled to the first reference voltage, a second terminal, and a control terminal coupled to the control terminal of the fourth conductive device;

wherein the transistor element has a controllable conduction path, with a first terminal coupled to the voltage on the control terminal of the power device, a second terminal coupled to the second reference voltage, and a control terminal coupled to the second terminal of the fifth conductive device; and wherein the resistive element has a first terminal coupled to the second terminal of the fifth conductive device and the control terminal of the sixth conductive device, and a second terminal coupled to the second reference voltage.

15. The circuit of claim 1, further comprising:

a resistive element with a first terminal coupled to the second terminal of the first conductive device and a second terminal coupled to the second reference voltage; and a second conductive device having a controllable conduction path, with a first terminal coupled to the voltage on the control terminal of the power device, a second terminal coupled to the second reference voltage, and a control terminal coupled to the first terminal of the resistive element.

16. A driver circuit having a slew rate control system, comprising:

a first source of current having a first terminal and a second terminal, with the first terminal coupled to a first reference voltage;

a second source of current having a first terminal and a second terminal, with the second terminal coupled to a second reference voltage, wherein the first source of current is of larger magnitude than the second source of current;

a first switch, having a first terminal and a second terminal and being provided with a control signal, with the first terminal of the first switch coupled to the second terminal of the first source of current and with the second terminal of the first switch coupled to the first terminal of the second source of current;

a second switch, having a first terminal, a second terminal, a third terminal, and the control signal as an input signal, with the first terminal of the second switch coupled to the first terminal of the second source of current and the second terminal of the second switch coupled to a third reference voltage characterized as having a lower magnitude of voltage than the first reference voltage;

a first conductive device having a controllable conduction path, with a first terminal of the first conductive device coupled to the first terminal of the second source of current and the first terminal of the second switch, a second terminal coupled to a conductive device reference voltage, and a control terminal coupled to the third terminal of the second switch;

a capacitive element having a first terminal coupled to the first terminal of the second source of current, the first terminal of the first switch, the first terminal of the first conductive device, and the first terminal of the second switch and having a second terminal coupled to a capacitive element reference voltage;

an amplifier having a first input terminal, a second input terminal and an output terminal, with the first input terminal coupled to a node at the first input terminal formed by the coupling of the first terminal of the capacitive element, the first terminal of the conducting element, the first terminal of the second switch, the first terminal of the second source of current, and the first terminal of the first switch, wherein the second input terminal is an inverting input terminal, the first reference voltage is applied to the amplifier, and the amplifier generates a voltage on the output terminal;

a power device, having a control terminal, a first terminal, a second terminal and characterized as having a conduction path between the first terminal and the second terminal, wherein the control terminal receives the voltage generated by the amplifier and controls conduction of the power device, the first terminal is coupled to the third reference voltage, the second terminal is coupled to the second input terminal of the amplifier, and an output voltage of the power device is resident on the second terminal of said power device, wherein the first conductive device conducts only when the control signal is the first logic level and the voltage generated by the amplifier is larger than the third reference voltage and the first conductive device will conduct until the voltage at the node at the first input terminal of the amplifier is reduced to be approximately equal to the third reference voltage, wherein when the control signal transitions from the first logic level to the second logic level the first switch conducts, the first source of current delivers a charging current to the capacitive element as the second source of current delivers a discharging current to the capacitive element resulting in a net charging current being supplied to the capacitive element, the output voltage generated by the power device increases to the third reference voltage, and a voltage on the control terminal of the power device increases to the first reference voltage, and wherein when the control signal transitions from the second logic level to the first logic level, the first switch does not conduct, the first source of current will not charge the capacitive element, the first conductive device conducts so long as the output voltage generated by the power device is larger than the third reference voltage, and the second source of current operates to quickly discharge the capacitive element so that the voltage at the node at the first input terminal of the amplifier is quickly reduced until the voltage at the node is approximately equal to the third reference voltage.

17. The circuit of claim 16, wherein the conductive device reference voltage is equal to the second reference voltage.

18. The circuit of claim 16, wherein the capacitive element reference voltage is equal to the second reference voltage.

19. The circuit of claim 16, wherein the first source of current is a first constant current source and the second source of current is a second constant current source.

20. The circuit of claim 16, wherein the rate of reduction of the voltage on the control terminal of the power device is limited only by the slew rate of the amplifier.

21. The circuit of claim 16, wherein the first conductive device is a first transistor and the driver circuit further comprises:

a voltage source interposed between the second switch and the third reference voltage that is equal to the third reference voltage less the threshold voltage of the first transistor and that prevents the first transistor from shutting off due to the threshold voltage of the first transistor, wherein the second terminal of the second switch is referenced to the voltage source.

22. The circuit of claim 21, wherein the voltage source comprises:
   a second transistor coupled to the third reference voltage; and
   a resistive element connected in series to the second transistor and coupled to the second reference voltage.

23. The circuit of claim 1, further comprising:
   a high current drive circuit coupled to the amplifier and the power device that facilitates the reduction of the voltage at the node at the first input terminal of the amplifier to the third reference voltage when the control signal transitions from the second logic level to the first logic level.

24. The circuit of claim 23, wherein the high current drive circuit comprises:
   a diode element;
   a resistive element; and
   a conductive element, with the diode element, the resistive element, and the conductive element connected in parallel between the amplifier and the power device.

25. The circuit of claim 23, wherein the rate of reduction of the voltage on the control terminal of the power device is limited by the high current drive circuit.

26. The circuit of claim 1, further comprising:
   a second conductive device having a controllable conduction path, with a first terminal coupled to the first terminal of the amplifier, a second terminal, and a control terminal coupled to the control terminal of the first conductive device, and the third terminal of the second switch;
   a resistive element with a first terminal coupled to the second terminal of the second conductive device and a second terminal coupled to the second reference voltage; and
   a third conductive device having a controllable conduction path, with a first terminal coupled to the control terminal of the power device, a second terminal coupled to the second reference voltage, and a control terminal coupled to the first terminal of the resistive element and the second terminal of the second conductive device,
   wherein when the control signal transitions from the second logic level to the first logic level, the second conductive device supplies current to the control terminal of the third conductive device causing the third conductive device to conduct to reduce the voltage on the control terminal of the power device.

27. The circuit of claim 26, wherein the rate of reduction of the voltage on the control terminal of the power device is limited by the third conductive device.

28. The circuit of claim 1, further comprising:
   a first current mirror coupled to the second terminal of the first conductive element and the second reference voltage;
   a second current mirror coupled to the first current mirror and the second reference voltage;
   a transistor element coupled to the second current mirror, the voltage on the control terminal of the power device and the second reference voltage; and
   a resistive element coupled to the second current mirror, the transistor element, and the second reference voltage,
   wherein when the control signal transitions from the second logic level to the first logic level, the first current mirror conducts so long as the voltage on the node is larger than the third reference voltage and the first current mirror and the second current mirror operate to provide current to the control terminal of the transistor element.

29. The circuit of claim 28, wherein the first current mirror comprises:
   a second conductive device having a controllable conduction path, with a first terminal coupled to the second terminal of the first conductive device, a second terminal coupled to the second reference voltage, and a control terminal coupled to the first terminal and the second terminal of the first conductive device; and
   a third conductive device having a controllable conduction path, with a first terminal, a second terminal coupled to the second reference voltage, and a control terminal coupled to the control terminal of the second conductive device; and
   wherein the second current mirror comprises:
      a fourth conductive device having a controllable conduction path, with a first terminal coupled to the first reference voltage, a second terminal coupled to the first terminal of the third conductive device, and a control terminal coupled to the second terminal; and
      a fifth conductive device having a controllable conduction path, with a first terminal coupled to the first reference voltage, a second terminal, and a control terminal coupled to the control terminal of the fourth conductive device;
   wherein the transistor element has a controllable conduction path, with a first terminal coupled to the voltage on the control terminal of the power device, a second terminal coupled to the second reference voltage, and a control terminal coupled to the second terminal of the fifth conductive device; and
   wherein the resistive element has a first terminal coupled to the second terminal of the fifth conductive device and the control terminal of the sixth conductive device, and a second terminal coupled to the second reference voltage.

30. The circuit of claim 1, further comprising:
   a resistive element with a first terminal coupled to the second terminal of the first conductive device and a second terminal coupled to the second reference voltage; and
   a second conductive device having a controllable conduction path, with a first terminal coupled to the voltage on the control terminal of the power device, a second terminal coupled to the second reference voltage, and a control terminal coupled to the first terminal of the resistive element.

* * * * *